United States Patent
Kim

(10) Patent No.: US 7,525,361 B2
(45) Date of Patent: Apr. 28, 2009

(54) HIGH SPEED FLIP-FLOPS AND COMPLEX GATES USING THE SAME

(75) Inventor: Min-su Kim, Hwaseong-si (KR)

(73) Assignee: Samsung Electronics Co., Ltd (KR)

( * ) Notice: Subject to any disclaimer, the term of this patent is extended or adjusted under 35 U.S.C. 154(b) by 219 days.

(21) Appl. No.: 11/095,187

(22) Filed: Mar. 31, 2005

(65) Prior Publication Data

US 2005/0225372 A1    Oct. 13, 2005

(30) Foreign Application Priority Data

Apr. 9, 2004    (KR) .................. 10-2004-0024507

(51) Int. Cl.
*H03K 3/356*    (2006.01)
(52) U.S. Cl. ..................... 327/208; 327/218
(58) Field of Classification Search .............. 327/218, 327/208, 210–212, 203, 201; 326/102, 46, 326/95, 144; 365/156, 194, 189.05
See application file for complete search history.

(56) References Cited

U.S. PATENT DOCUMENTS

| | | | | |
|---|---|---|---|---|
| 5,663,669 | A * | 9/1997 | Vanderschaaf | 327/201 |
| 5,841,304 | A | 11/1998 | Tam | 327/161 |
| 5,898,330 | A | 4/1999 | Klass | 327/210 |
| 6,329,845 | B1 | 12/2001 | Taki | |
| 6,333,656 | B1 | 12/2001 | Schober | 327/202 |
| 6,433,603 | B1 | 8/2002 | Singh et al. | |
| 6,448,829 | B1 | 9/2002 | Saraf | 327/200 |
| 6,459,316 | B1 | 10/2002 | Vangal et al. | |
| 6,522,184 | B2 * | 2/2003 | Sato | 327/203 |
| 6,566,927 | B2 | 5/2003 | Park et al. | |
| 6,597,223 | B2 | 7/2003 | Vangal et al. | 327/202 |
| 6,617,902 | B2 * | 9/2003 | Tokumasu et al. | 327/211 |
| 6,794,914 | B2 | 9/2004 | Sani et al. | |

(Continued)

FOREIGN PATENT DOCUMENTS

KR    1999-0051453    7/1999

*Primary Examiner*—Tuan Lam
*Assistant Examiner*—Diana J Cheng
(74) *Attorney, Agent, or Firm*—Mills & Onello LLP

(57) ABSTRACT

In high-speed flip-flops and complex gates using the same, the flip-flop includes a first PMOS transistor and second and third NMOS transistors, which are serially connected between a power supply voltage and a ground voltage. Gates of the first PMOS transistor and the second NMOS transistor are connected to input data. A gate of the third NMOS transistor is connected to a clock pulse signal. A logic level of a first intermediate node between the first PMOS transistor and the second NMOS transistor is latched by a first latch. The flip-flop further includes a fourth PMOS transistor and fifth and sixth NMOS transistors, which are serially connected between a power supply voltage and a ground voltage. Gates of the fourth PMOS transistor and the fifth NMOS transistor are connected to the first intermediate node. A gate of the sixth NMOS transistor is connected to the clock pulse signal. A logic level of a second intermediate node between the fourth PMOS transistor and the fifth NMOS transistor is latched by a second latch. Accordingly, intermediate nodes of the flip-flops are connected to ground voltages via two NMOS transistors upon logic level switching, rather than three or more, so that the switching time of the device is shortened.

23 Claims, 21 Drawing Sheets

U.S. PATENT DOCUMENTS 6,822,482 B2    11/2004  Campbell
6,825,691 B1 *  11/2004  Chu et al. ..................... 326/46
7,327,169 B2     2/2008  Osame et al.
2002/0000833 A1 *  1/2002  Taki ........................... 326/102
2003/0193352 A1 * 10/2003  Campbell ................... 326/95

* cited by examiner

US 7,525,361 B2

HIGH SPEED FLIP-FLOPS AND COMPLEX GATES USING THE SAME

BACKGROUND OF THE INVENTION

This application claims the benefit of Korean Patent Application No. 2004-24507, filed on Apr. 9, 2004, in the Korean Intellectual Property Office, the disclosure of which is incorporated herein in its entirety by reference.

1. Field of the Invention

The present invention relates to flip-flops, and more particularly, to high-speed flip-flops and complex gates using the same.

2. Description of the Related Art

Flip-flops are general-purpose data storage elements used in digital electronic circuits. The flip-flops are important in the design of digital circuits because the flip-flops are clocked storage elements that enable a sequential and stable logic design. In logic designs, flip-flops are used to store logic states, parameters, or digital control signals.

For example, contemporary microprocessors typically include numbers of flip-flops. To meet the operation requirements of a high performance microprocessor, flip-flop setup & hold time and a clock-to-output time should be reduced in order to provide for a maximum logic clocking speed. The flip-flops are also required to provide for short data response time by reducing the data-to-clock time.

FIG. 1 is a schematic diagram of a conventional flip-flop 100. Referring to FIG. 1, the flip-flop 100 generates a signal at a node N125 and an output signal QN according to a logic level of input data D received in response to a clock signal CK. The input data D is connected to gates of a PMOS transistor 108 and an NMOS transistor 110. The clock signal CK is connected to a gate of an NMOS transistor 112. An output of a cascade of three inverters 102, 104, and 106, which receive the clock signal CLK, is connected to a gate of an NMOS transistor 114. Transistors 108, 110, 112, and 114 are serially connected between a power supply voltage VDD and a ground voltage VSS.

A node N109 between the PMOS transistor 108 and the NMOS transistor 110 maintains a constant logic level using PMOS transistors 116, 120, and 118. The PMOS transistor 116 is connected to a power supply voltage VDD and gated to the clock signal CK, the PMOS transistor 120 is gated to the output of the inverter 106, and the PMOS transistor 118 is connected to the PMOS transistors 116 and 120 and gated to a node N125. An NMOS transistor 122 is gated to the node N125, is connected between a node N111 between the NMOS transistors 110 and 112 and a ground voltage GND through the NMOS transistor 114, and determines a logic level of the node N111.

A PMOS transistor 124 and NMOS transistors 126, 128, and 130 are serially connected between a power supply voltage VDD and a ground voltage VSS. Gates of the transistors 124 and 126 are connected to the node N109, a gate of the transistor 128 is connected to the clock signal CK, and a gate of the transistor 130 is connected to the output of the inverter 106. A signal at the node N125, which is between the transistors 124 and 126, passes through a first inverter 140 and is output as an output signal QN. The node N125 is connected to an inverter 138, and a logic level of the node N125 is determined and maintained at a constant level using a PMOS transistor 132 and an NMOS transistor 134, which respond to an output of the inverter 138, and an NMOS transistor 136, which is gated to the node N109.

Operation of the flip-flop 100 is illustrated in the timing diagram of FIG. 2. Referring to FIG. 2, the clock signal CK is periodically input to the flip-flop 100. As the clock CK pulses, the data D transitions from a logic low level to a logic high level and then from the logic high level to a logic low level, as shown. At time t2, that is, when the clock signal CK is at a rising edge, the data D is transitioned from a logic low level to a logic high level. In response to the transition of the data D, the node N109, the node N125, and the output signal QN are transitioned from a logic high level to a logic low level, from a logic low level to a logic high level, and from a logic high level to a logic low level, respectively. At time t6, that is, when the clock signal CK is at a rising edge, the data D is transitioned from the logic high level to the logic low level. In response to the transition of the data D, the node N109, the node N125, and the output signal QN are transitioned from the logic low level to the logic high level, from the logic high level to the logic low level, and from the logic low level to the logic high level, respectively. In other words, the signal at the node N125 is generated according to a logic level of the data D, and the output signal QN is generated according to an inverted logic level of the data D.

Essential nodes that determine a speed at which the flip-flop 100 operates, for example, the data-to-output time of the flip flop, are the nodes N109 and N125, which are intermediate nodes. Particularly, times required to transit logic high levels of the nodes N109 and N125 to logic low levels are important to determine the speed of the flip-flop 100. For example, the node N109 is connected to the ground voltage VSS via the transistors 110, 112, and 114, and the node N125 is connected to the ground voltage VSS via the transistors 126, 128, and 130. Hence, transistors 110, 112, 114, 126, 128, and 130 are loads on the nodes, which lead to an increase the transition times (switching times) of the nodes N109 and N125.

SUMMARY OF THE INVENTION

The present invention provides a high speed flip-flop. The flip-flop operates at a high speed by reducing the data-to-output time of the flip-flop due to a reduction of loads of the intermediate nodes of the device.

The present invention also provides complex gates employing the flip-flop. When this flip-flop is used in a complex gate, such as, an AND gate, an OR gate, an AOI gate, or the like, the complex gate can operate in a faster manner, as compared to conventional complex gates, in order to perform a logic output function.

According to an aspect of the present invention, there is provided a flip-flop including: a first PMOS transistor having a source to which a power supply voltage is connected and a gate to which input data is applied; a second NMOS transistor having a drain to which a drain of the first PMOS transistor is connected and a gate to which the input data is applied; a third NMOS transistor having a drain to which a source of the second NMOS transistor is connected, a gate to which a clock pulse signal is applied, and a source to which a ground voltage is connected; a first latch latching a logic level of a first node between the first PMOS transistor and the second NMOS transistor and a level of a second node between the second and third NMOS transistors; a fourth PMOS transistor having a source to which the power supply voltage is connected and a gate to which the first node is connected; a fifth NMOS transistor having a drain to which a drain of the fourth PMOS transistor is connected and a gate to which the first node is connected; a sixth NMOS transistor having a drain to which a source of the fifth NMOS transistor is connected, a gate to which the clock pulse signal is connected, and a source to which the ground voltage is connected; and a second latch latching a logic level of a third node between the fourth PMOS transistor and the fifth NMOS transistor.

According to another aspect of the present invention, there is provided a flip-flop including: a first PMOS transistor having a source to which a power supply voltage is connected and a gate to which a second clock signal is applied; a second NMOS transistor having a drain to which a drain of the first PMOS transistor is connected and a gate to which a clock pulse signal is applied; a third NMOS transistor having a drain to which a source of the second NMOS transistor is connected, a gate to which input data is connected, and a source to which a ground voltage is connected; a first latch latching a logic level of a first node between the first PMOS transistor and the second NMOS transistor; a fourth PMOS transistor having a source to which the power supply voltage is connected and a gate to which the first node is connected; a fifth NMOS transistor having a drain to which a drain of the fourth PMOS transistor and a gate to which the second clock signal is connected; a sixth NMOS transistor having a drain to which a source of the fifth NMOS transistor is connected, a gate to which the first node is connected, and a source to which the ground voltage is connected; and a second latch latching a logic level of a second node between the fourth PMOS transistor and the fifth NMOS transistor.

According to still another aspect of the present invention, there is provided a flip-flop including: a first PMOS transistor having a source to which a power supply voltage is connected and a gate to which a second clock signal is applied; a second NMOS transistor having a drain to which a drain of the first PMOS transistor is connected and a gate to which input data is applied; a third NMOS transistor having a drain to which a source of the second NMOS transistor is connected, a gate to which a clock pulse signal is applied, and a source to which a ground voltage is connected; a first latch latching a logic level of a first node between the first PMOS transistor and the second NMOS transistor; a fourth PMOS transistor having a source to which the power supply voltage is connected and a gate to which the first node is connected; a fifth NMOS transistor having a drain to which a drain of the fourth PMOS transistor and a gate to which the first node is connected; a sixth NMOS transistor having a drain to which a source of the fifth NMOS transistor is connected and a gate to which the clock pulse signal is connected; and a second latch latching a logic level of a second node between the fourth PMOS transistor and the fifth NMOS transistor.

According to still another aspect of the present invention, there is provided a flip-flop comprising: a first PMOS transistor having a source to which a power supply voltage is connected and a gate to which a second clock signal is applied; a second NMOS transistor having a drain to which a drain of the first PMOS transistor is connected and a gate to which input data is applied; a third NMOS transistor having a drain to which a source of the second NMOS transistor is connected, a gate to which a clock pulse signal is applied, and a source to which a ground voltage is connected; a first latch latching a logic level of a first node between the first PMOS transistor and the second NMOS transistor; a fourth PMOS transistor having a source to which the power supply voltage is connected and a gate to which the first node is connected; a fifth NMOS transistor having a drain to which a drain of the fourth PMOS transistor and a gate to which the first node is connected; a sixth NMOS transistor having a drain to which a source of the fifth NMOS transistor is connected and a gate to which the clock pulse signal is connected; and a second latch latching a logic level of a second node between the fourth PMOS transistor and the fifth NMOS transistors.

According to still other aspects of the present invention, there are provided complex gates in the form of a 3-input AND gate, 3-input OR gate, 4-input AOI gate, and the like.

Accordingly, intermediate nodes of the flip-flops and gates of the present invention are connected to a ground voltage via a path that includes two NMOS transistors upon logic level switching in contrast with conventional flip-flops in which three NMOS transistors are used, so that the switching time is shortened. Also, complex gates employing the flip-flops, in accordance with the present invention have relatively short switching time periods.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
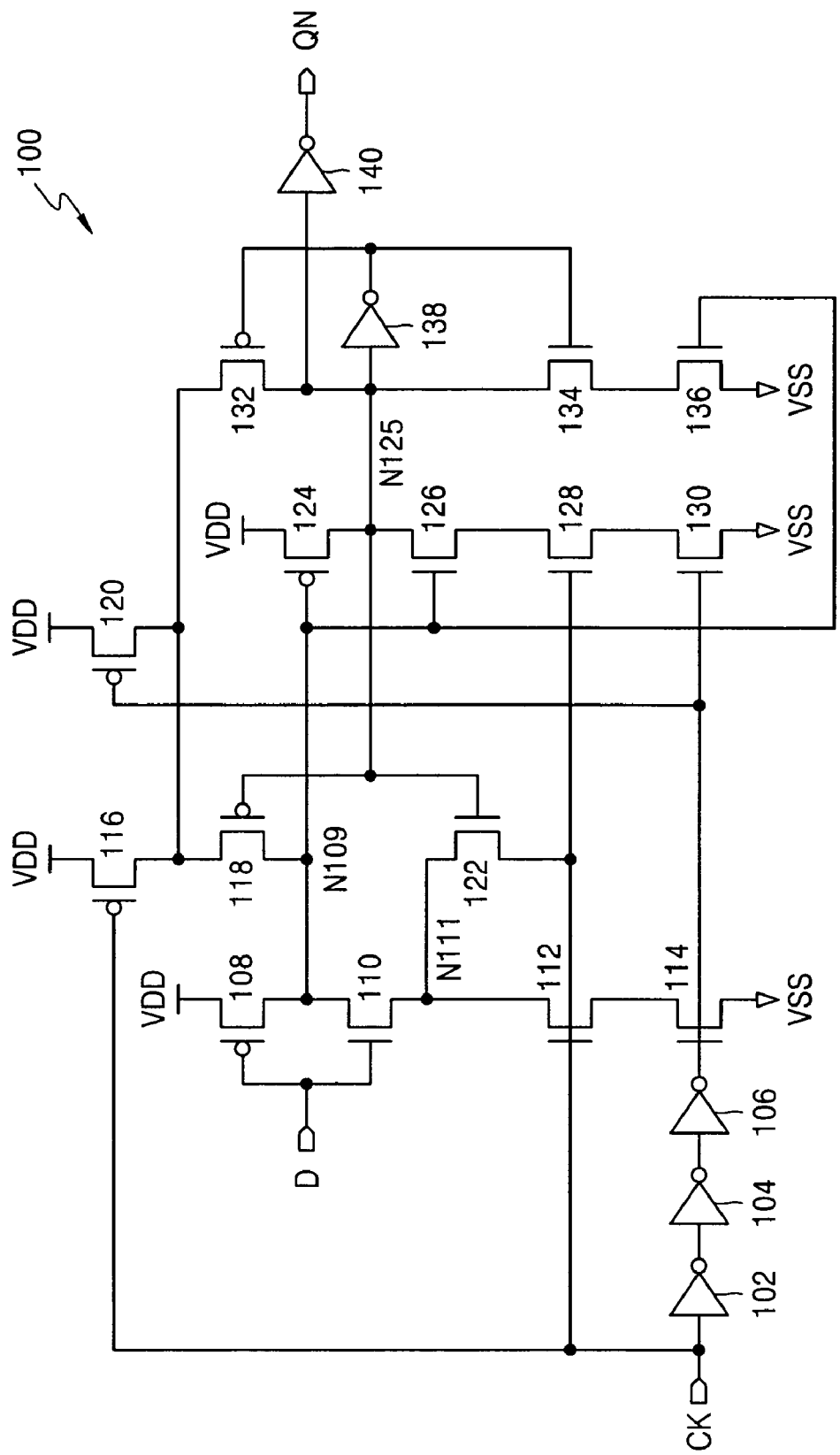
FIG. 1 is a schematic diagram of a conventional flip-flop.
Figure 2:
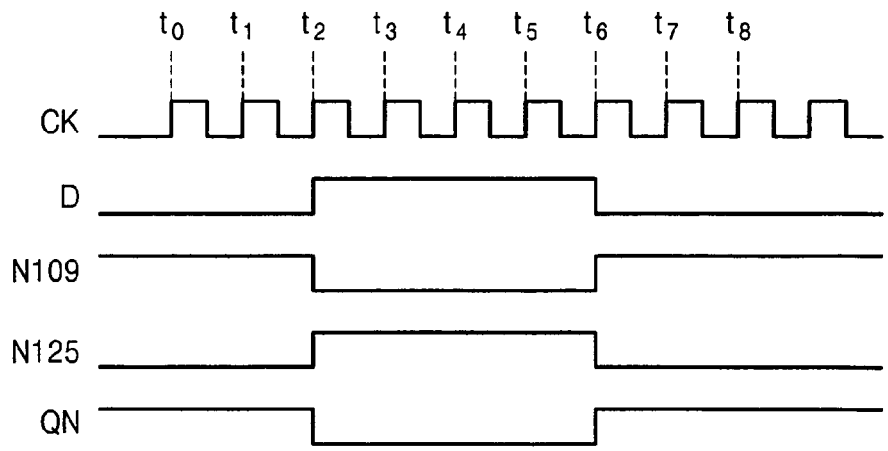
FIG. 2 is a timing diagram illustrating an operation of the flip-flop of FIG. 1.

The attached drawings are for illustrating preferred embodiments of the present invention, and the contents of the attached drawings are referred to in order to gain a sufficient understanding of the merits of the present invention and the operation thereof, and the objectives accomplished by the operation of the present invention. Hereinafter, the present invention will be described in detail by explaining preferred embodiments of the invention with reference to the attached drawings. Like reference numerals in the drawings denote like elements.

To more clarify the digital operation of a flip-flop, timing diagrams used in the present specification do not take into consideration a predetermined time delay that physically occurs while data or signals are passing through transistors and logic gates.

Figure 3:
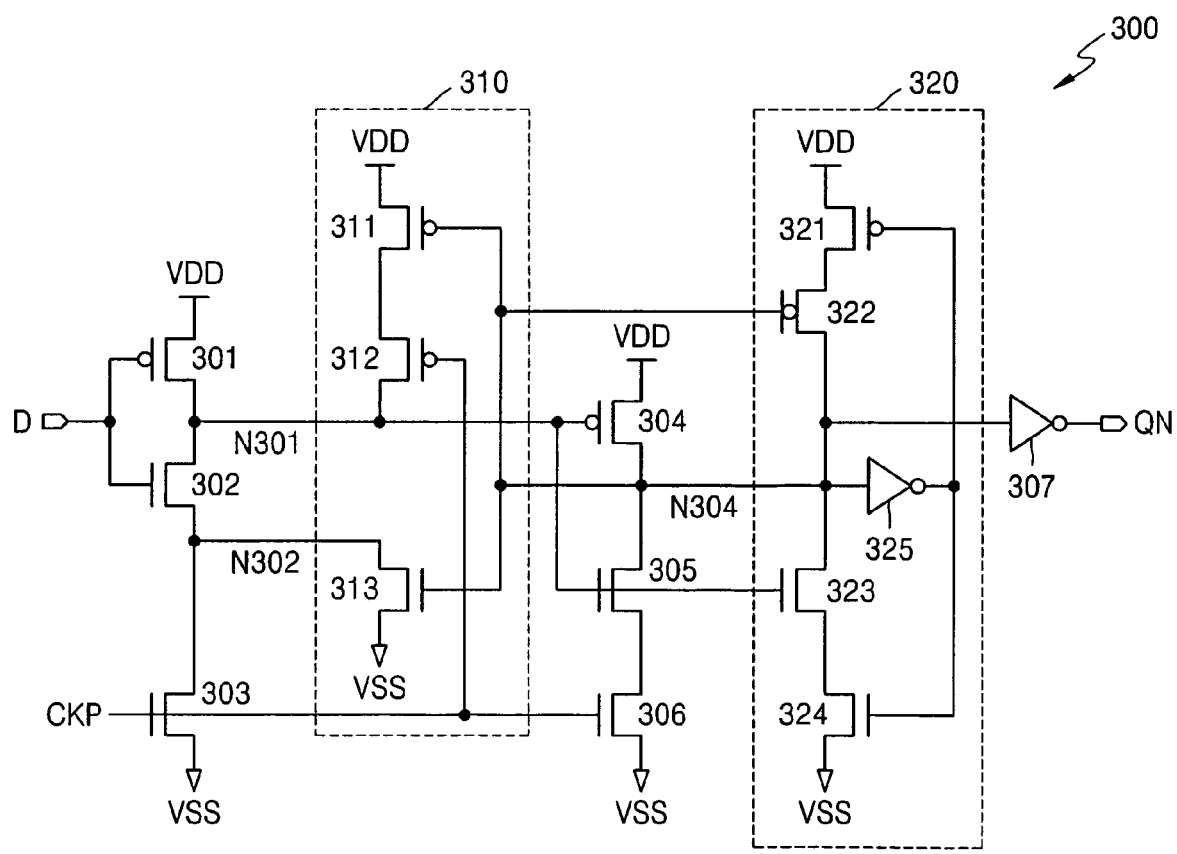
FIG. 3 is a schematic diagram of a flip-flop according to an embodiment of the present invention.

FIG. 3 is a schematic diagram of a flip-flop 300 according to an embodiment of the present invention. Referring to FIG. 3, the flip-flop 300 includes a PMOS transistor 301 and NMOS transistors 302 and 303, which are serially connected between a power supply voltage VDD and a ground voltage VSS. Gates of the PMOS transistor 301 and the NMOS transistor 302 are connected to input data D. A gate of the NMOS transistor 303 is connected to a clock pulse signal CKP. A node N301 between the PMOS transistor 301 and the NMOS transistor 302 is connected to a first latch 310.

The flip-flop 300 further includes a PMOS transistor 304 and NMOS transistors 305 and 306, which are serially connected between a power supply voltage VDD and a ground voltage VSS. Gates of the PMOS transistor 304 and the NMOS transistor 305 are connected to the node N301. A gate of the NMOS transistor 306 is connected to the clock pulse signal CKP. A node N304 between the PMOS transistor 304 and the NMOS transistor 305 is connected to a second latch 320 and then to a first inverter 307, which outputs an output signal QN.

The first latch 310 includes PMOS transistors 311 and 312, which are serially connected between a power supply voltage VDD and the node N301, and an NMOS transistor 313, which is connected between a node N302 between the NMOS transistors 302 and 303 and the ground voltage VSS. Gates of the PMOS transistor 311 and the NMOS transistor 313 are connected to the node N304. A gate of the PMOS transistor 312 is connected to the clock pulse signal CKP.

The second latch 320 includes PMOS transistors 321 and 322 and NMOS transistors 323 and 324, which are serially connected between a power supply voltage VDD and a ground voltage VSS. A junction of the PMOS transistor 322 and the NMOS transistor 323 is connected to the node N304, which is also connected to a second inverter 325. A gate of the PMOS transistor 321 is connected to an output of the second inverter 325, a gate of the PMOS transistor 322 is connected to the node N304, a gate of the NMOS transistor 323 is connected to the node N301, and a gate of the NMOS transistor 324 is connected to the output of the second inverter 325.

Figure 4A:
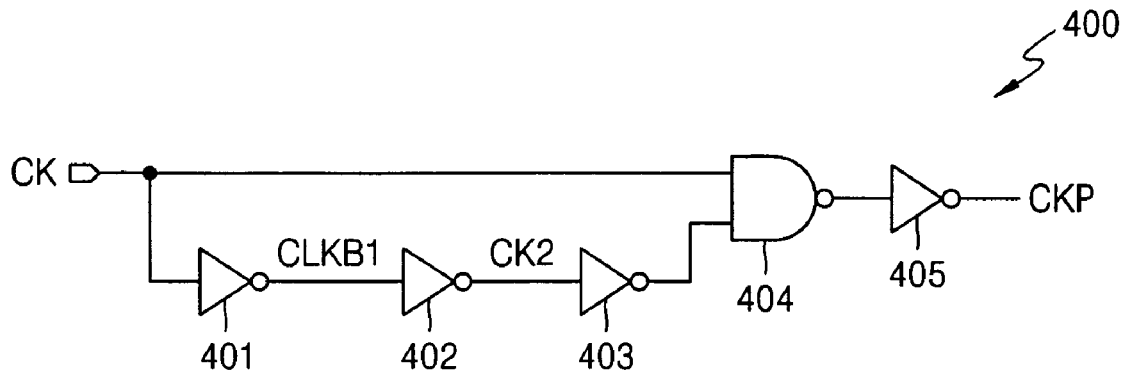
FIGS. 4A through 4D are circuit diagrams of clock pulse generation circuits for generating a clock pulse signal used in the flip-flop of FIG. 3.

Several types of clock pulse generation circuits, each generating the clock pulse signal CKP from an input clock signal CK are illustrated in FIGS. 4A through 4D. Referring to FIG. 4A, a clock pulse generation circuit 400 includes inverters 401, 402, and 403, which are serially connected to one another and receive the clock signal CK, a NAND gate 404, which receives an output of the inverter 403 and the clock signal CK, and an inverter 405, which receives an output of the NAND gate 404 and generates the clock pulse signal CKP. An output of the first inverter 401 is a first clock signal CKB1, and an output of the second inverter 402 is a second clock signal CK2. The clock signal CK is usually an external clock signal that has low and high levels for predetermined durations. The clock pulse signal CKP is generated as a high-level pulse on every rising edge of the clock signal CK.

Figure 4B:
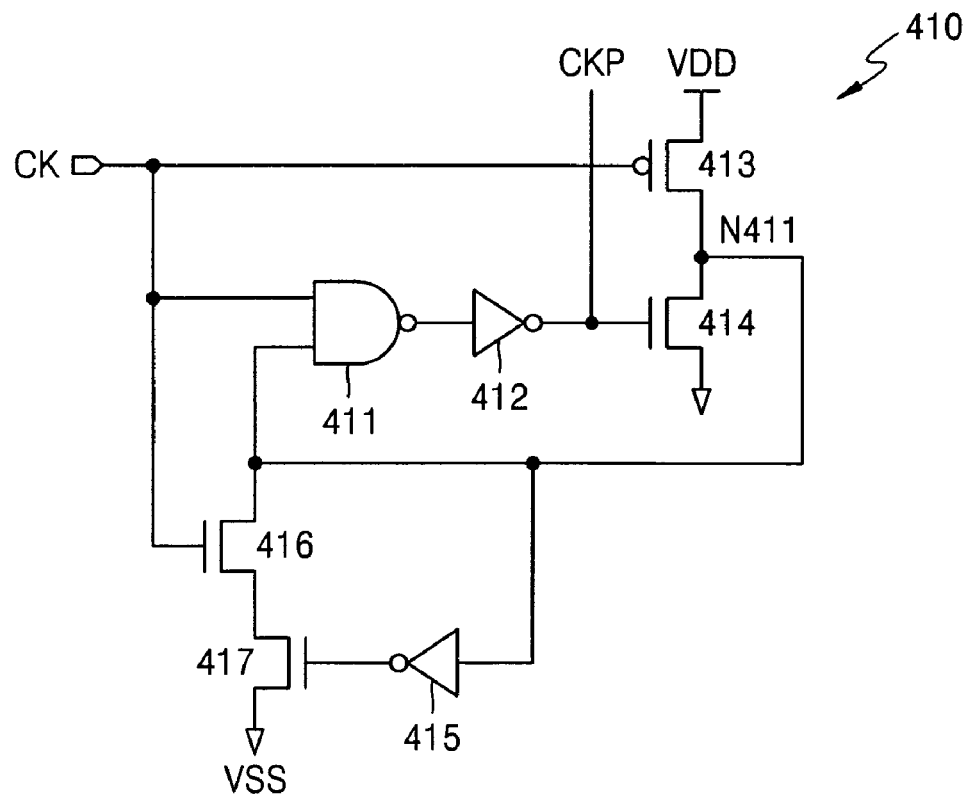

Referring to FIG. 4B, another embodiment of the clock pulse generation circuit 410 includes a NAND gate 411, first and second inverters 412 and 415, a PMOS transistor 413, and NMOS transistors 414, 416, and 417. The NAND gate 411 receives the clock signal CK and a signal provided at a node N411 between the PMOS transistor 413 and the NMOS transistor 414. The first inverter 412 receives an output of the NAND gate 411. The PMOS transistor 413 and the NMOS transistor 414 are serially connected between a power supply voltage VDD and a ground voltage VSS. The second inverter 415 is connected to the node N411. The NMOS transistors 416 and 417 are serially connected between the node N411 and a ground voltage VSS. A gate of the PMOS transistor 413 is connected to the clock signal CK, and a gate of the NMOS transistor 414 is connected to an output of the first inverter 412. The output of the first inverter 412 is the clock pulse signal CKP. A gate of the NMOS transistor 416 is connected to the clock signal CK, and a gate of the NMOS transistor 417 is connected to an output of the second inverter 415.

Figure 4C:
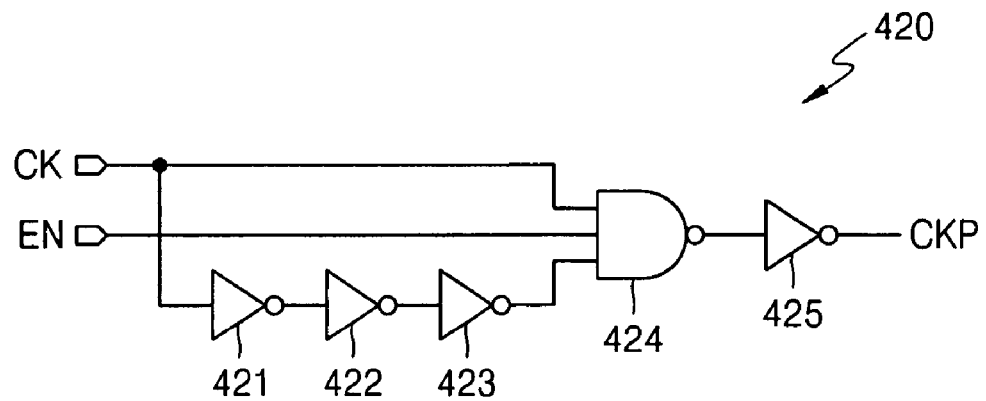

Referring to FIG. 4C, a third embodiment of the clock pulse generation circuit 420 includes inverters 421, 422, and 423, which are serially connected to one another and receive the clock signal CK, a NAND gate 424, which receives the clock signal CK, an enable signal EN, and an output of the inverter 423, and an inverter 425, which receives an output of the NAND gate 424 and generates the clock pulse signal CKP. When the enable signal EN is in a high level, the clock pulse generation circuit 420 operates in the same manner as the clock pulse generation circuit 400 of FIG. 4A.

Figure 4D:
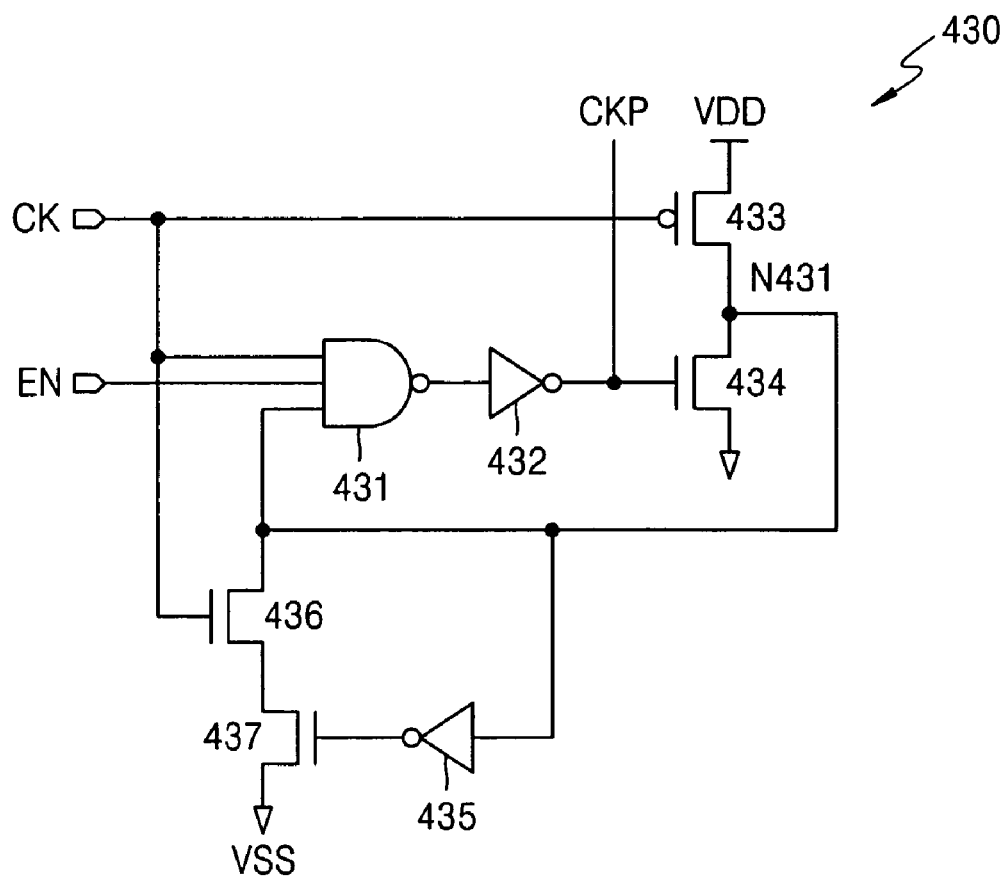

Referring to FIG. 4D, a fourth embodiment of the clock pulse generation circuit 430 includes a NAND gate 431, first and second inverters 432 and 435, a PMOS transistor 433, and NMOS transistors 434, 436, and 437. The NAND gate 431 receives the clock signal CK, the enable signal EN, and a signal provided at a node N431 between the PMOS transistor 433 and the NMOS transistor 434. The first inverter 432 receives an output of the NAND gate 431. The PMOS transistor 433 and the NMOS transistor 434 are serially connected between a power supply voltage VDD and a ground voltage VSS. The second inverter 435 is connected to the node N431. The NMOS transistors 436 and 437 are serially connected between the node N431 and a ground voltage VSS. A gate of the PMOS transistor 433 is connected to the clock signal CK, and a gate of the NMOS transistor 434 is connected to an output of the first inverter 432. The output of the first inverter 432 is the clock pulse signal CKP. A gate of the NMOS transistor 436 is connected to the clock signal CK, and a gate of the NMOS transistor 437 is connected to an output of the second inverter 435. When the enable signal EN is in a high level, the clock pulse generation circuit 430 operates in the same manner as the clock pulse generation circuit 410 of FIG. 4B.

Figure 5:
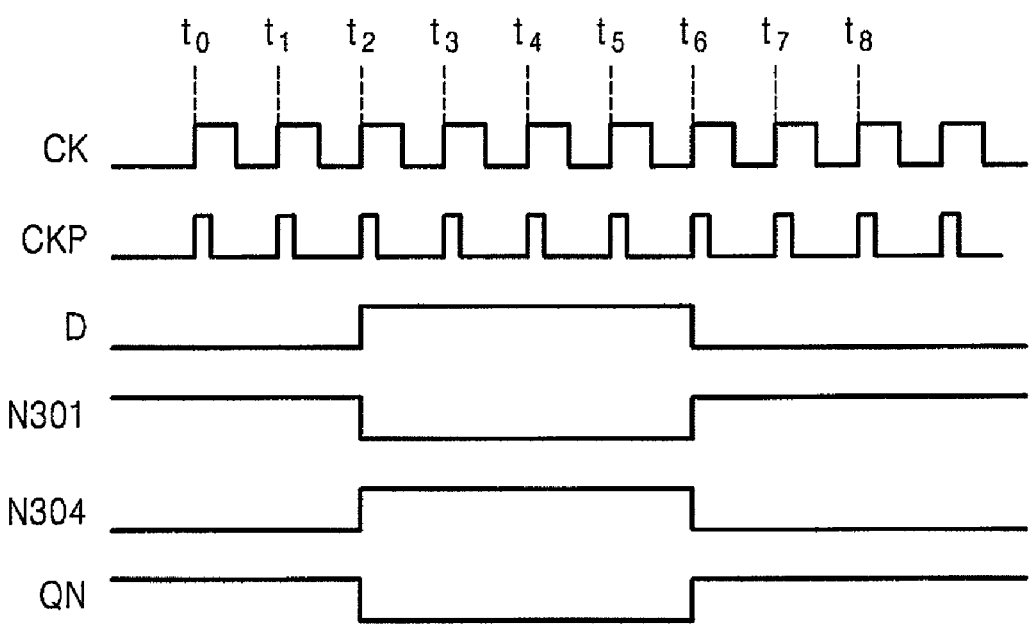
FIG. 5 is a timing diagram illustrating an operation of the flip-flop of FIG. 3.

FIG. 5 is a timing diagram illustrating an operation of the flip-flop 300 of FIG. 3. Referring to FIG. 5, clock pulses of the clock pulse signal CKP are generated on rising edges of sequential clock pulses of the clock signal CK. At time t2, the data D is transitioned from a logic low level to a logic high level. In response to this transition of the data D and a high level pulse of the clock pulse signal CKP, the NMOS transistors 302 and 303 are turned on, so the node N301 is transitioned from a logic high level to a logic low level. In response to the transition of the node N301 to the logic low level, the PMOS transistor 304 is turned on, so the node N304 is transitioned from a logic low level to a logic high level. In response to the transition of the node N301 to the logic low level, the NMOS transistor 305 is turned off, and the pathway toward the ground voltage VSS is opened.

In response to the transition of the node N304 to the logic high level, the PMOS transistor 311 is turned off. In response to a high level pulse of the clock pulse signal CKP, the PMOS transistor 312 is turned off. Thereafter, in response to a low level pulse of the clock pulse signal CKP, the PMOS transistor 312 is turned on, but a supply of the power supply voltage VDD to the node N301 is completely blocked because the PMOS transistor 311 is turned off. Hence, the low level of the node N301 is maintained. In response to the transition of the node N304 to the logic high level, the NMOS transistor 313 is turned on, so the logic low level of the node N301 is maintained. In response to the transition of the node N304 to the logic high level, the output of the second inverter 325 is transitioned from a logic high level to a logic low level.

In response to the low level output of the second inverter 325, the PMOS transistor 321 is turned on. But, in response to the transition of the node N304 to the logic high level, the PMOS transistor 322 is turned off. In response to the transition of the node N301 to the logic low level, the NMOS transistor 323 is turned off. In response to the low level output of the second inverter 325, the NMOS transistor 324 is turned off. Hence, the logic high level of the node N304 is maintained. A signal at the node N304 in the logic high level passes through the first inverter 307 and is output as an output signal QN at a logic low level.

At time t6, the logic high level of the data D is transitioned to a logic low level. In response to a high level pulse of the clock pulse signal CKP, the NMOS transistor 303 is turned on. However, in response to the transition of the data D to the logic low level, the PMOS transistor 301 and the NMOS transistor 302 are turned on and off, respectively, so the logic low level of the node N301 is transitioned to the logic high level. In response to the transition of the node N301 to the logic high level, the PMOS transistor 304 is turned off, and the NMOS transistor 305 is turned on. In response to a high level pulse of the clock pulse signal CKP, the NMOS transistor 306 is turned on. The logic high level of the node N304 is transitioned to a logic low level by the turned-on NMOS transistors 305 and 306.

In response to the transition of the node N304 to the logic low level, the PMOS transistor 311 is turned on. In response to a high level pulse of the clock pulse signal CKP, the PMOS transistor 312 is turned off. In response to the transition of the node N304 to the logic low level, the NMOS transistor 313 is turned off. Thereafter, in response to a low level pulse of the clock pulse signal CKP, the PMOS transistor 312 is turned on, so the high level of the node N301, that is, a power supply voltage level, is maintained. In response to the transition of the node N304 to the logic low level, the logic low level of the output of the second inverter 325 is transitioned to a logic high level.

In response to the high level output of the second inverter 325, the PMOS transistor 321 is turned off. In response to the transition of the node N304 to the logic low level, the PMOS transistor 322 is turned on. In response to the transition of the node N301 to the logic high level, the NMOS transistor 323 is turned on. In response to the high level output of the second inverter 325, the NMOS transistor 324 is turned on. Hence, the logic low level of the node N304 is maintained by the turned-on NMOS transistors 323 and 324. A signal at the node N304 at the logic low level passes through the first inverter 307 and is output as an output signal QN at a logic high level.

In the flip-flop 300, a signal pathway from the node N301, which is an intermediate node, to the ground voltage VSS, is formed by two transistors, which are the NMOS transistors 302 and 303. Also, a signal pathway from the node N304, which is an intermediate node, to the ground voltage VSS is formed by two transistors, which are the NMOS transistors 305 and 306. Hence, in comparison with the conventional flip-flop 100 of FIG. 1 in which passages from the intermediate nodes N109 and N125 to ground voltages VSS are each formed by three transistors, the flip-flop 300 of the embodiment of FIG. 3 of the present specification decreases the switching times by 30% or more, since the load on the signal pathway is reduced by at least 30%. Since the logic level of the node N301 is maintained at a logic low level while the logic level of the input data D is logic high, the flip-flop 300 is referred to as a static flip-flop.

Figure 6:
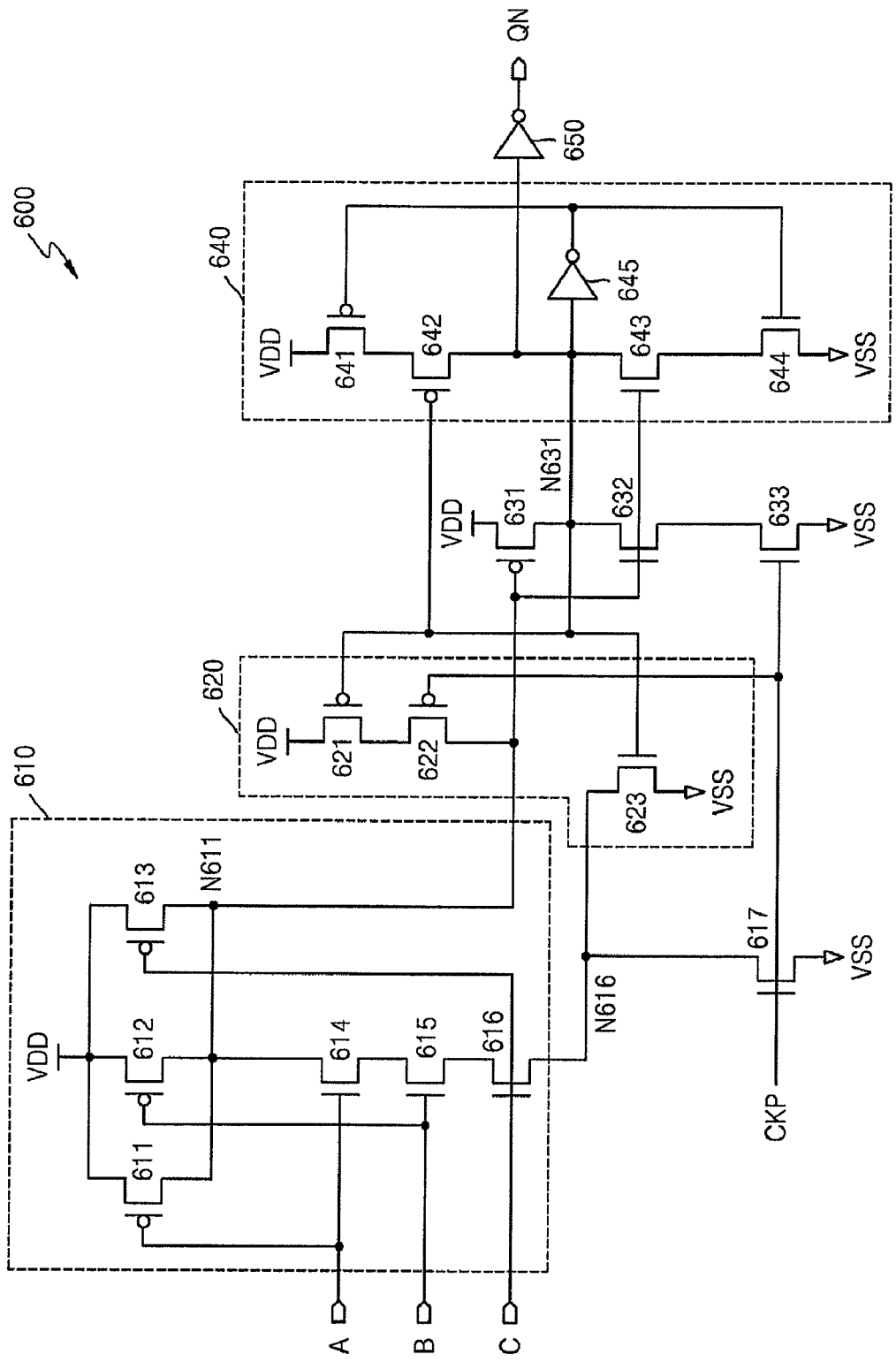
FIG. 6 is a schematic diagram of a 3-input AND gate using the flip-flop of FIG. 3.
Figure 7:
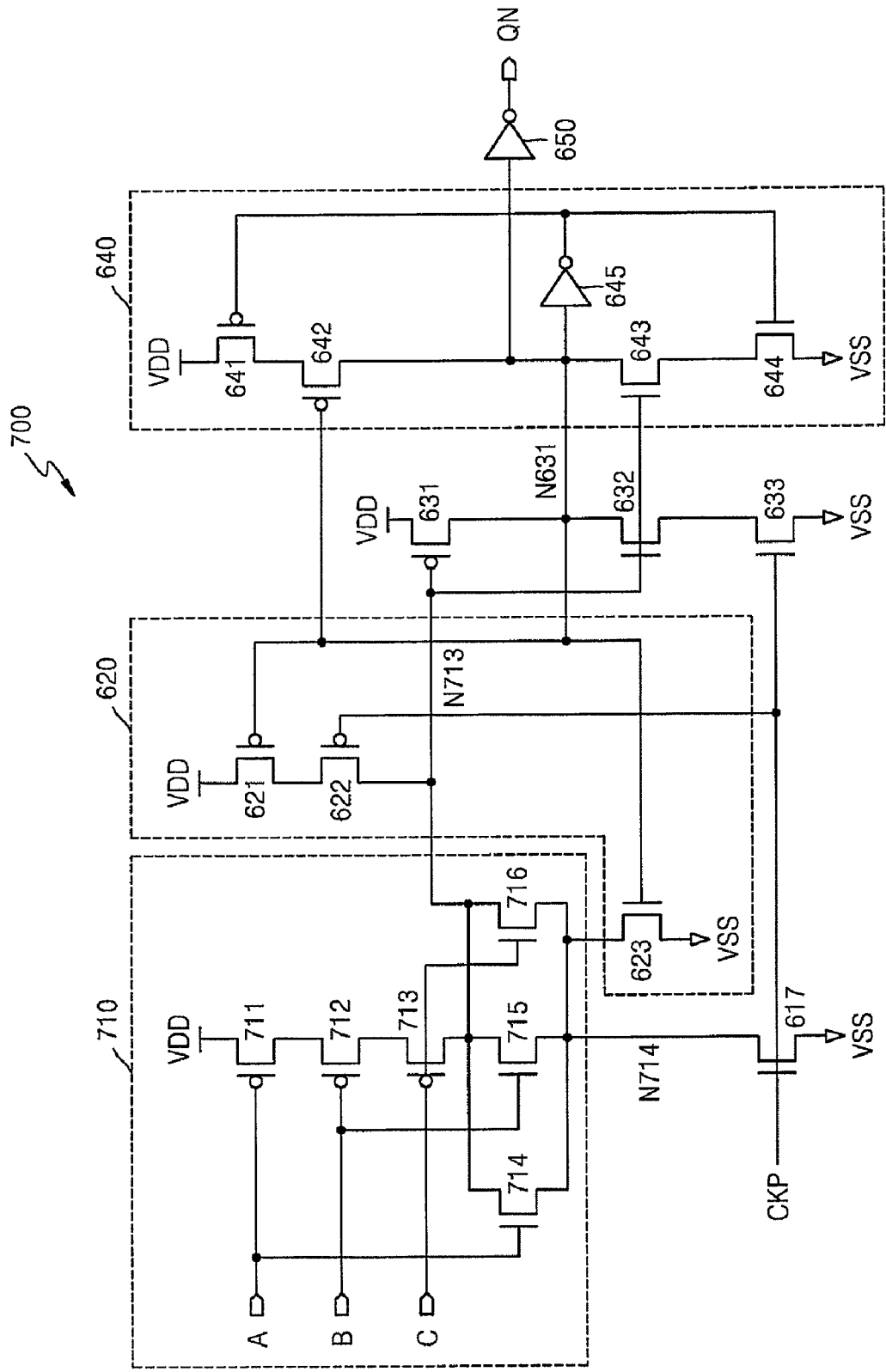
FIG. 7 is a schematic diagram of a 3-input OR gate using the flip-flop of FIG. 3.
Figure 8:
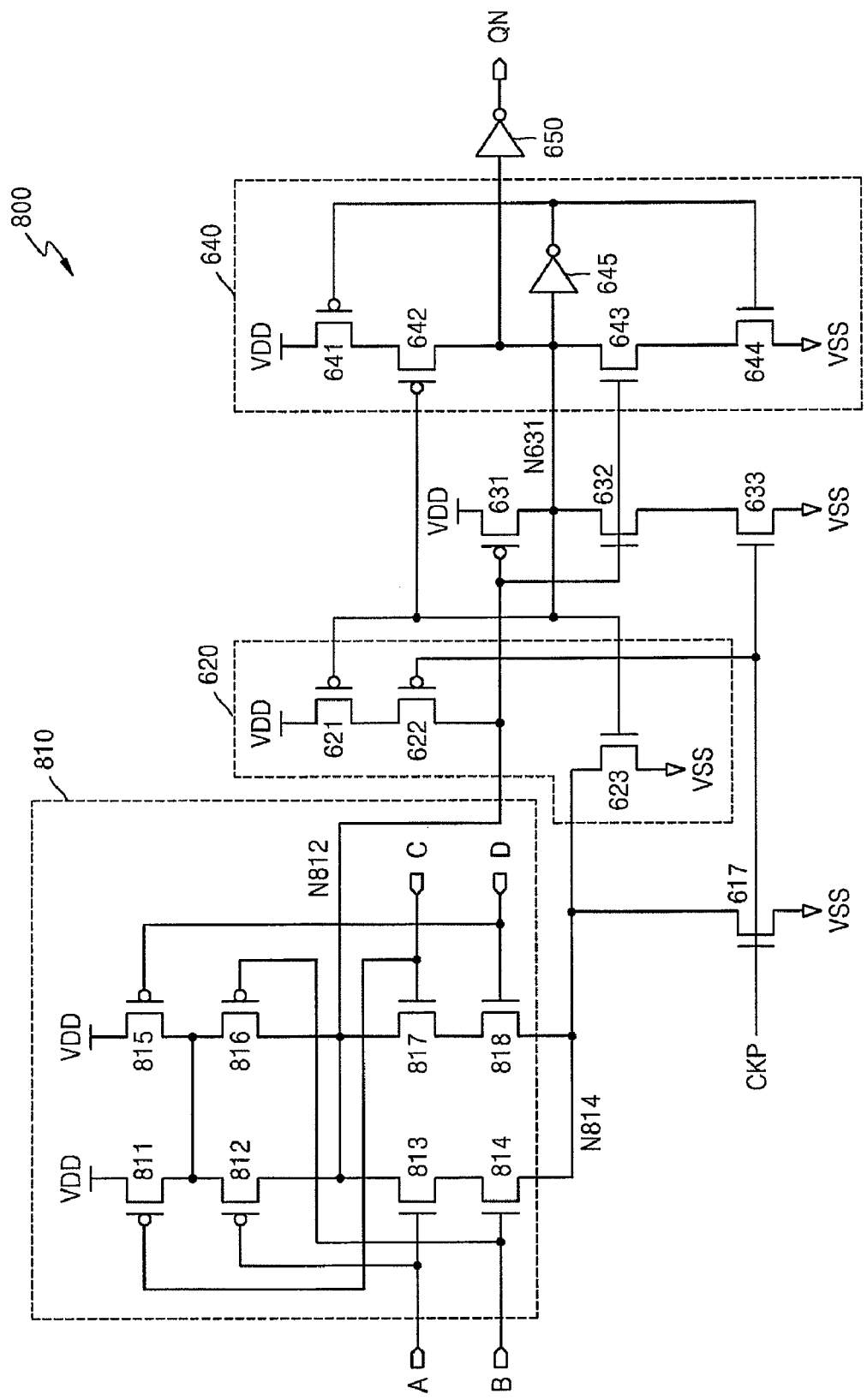
FIG. 8 is a schematic diagram of a 4-input AOI gate using the flip-flop of FIG. 3.

Complex gates to which the flip-flop 300 of FIG. 3 is applied are illustrated in FIGS. 6 through 8. FIG. 6 is a schematic diagram of a 3-input AND gate 600 based on the flip-flop 300 of FIG. 3. The 3-input AND gate 600 performs an AND operation on three input data A, B, and C received via an input portion 610 in response to a clock pulse signal CKP and generates an output signal QN. The 3-input AND gate 600 includes the input portion 610, NMOS transistors 617, 631, 632, and 633, first and second latches 620 and 640, and a first inverter 650.

The input portion 610 includes three PMOS transistors 611, 612, and 613, which are connected in parallel to each other between a power supply voltage VDD and a node N611, and 3 NMOS transistors 614, 615, and 616, which are serially connected to each other between the node N611 and a node N616. Gates of the PMOS transistor 611 and the NMOS transistor 614 are connected to the input data A. Gates of the PMOS transistor 612 and the NMOS transistor 615 are connected to the input data B. Gates of the PMOS transistor 613 and the NMOS transistor 616 are connected to the input data C.

The NMOS transistor 617 is connected between the node N616 and a ground voltage VSS and gated to the clock pulse signal CKP. The first latch 620 includes PMOS transistors 621 and 622, which are serially connected between a power supply voltage VDD and the node N611, and an NMOS transistor 623, which is connected between the node N616 and a ground voltage VSS. A gate of the PMOS transistor 621 is connected to a node N631, a gate of the PMOS transistor 622 is connected to the clock pulse signal CKP, and a gate of the NMOS transistor 623 is connected to the node N631.

Transistors 631, 632, and 633 are serially connected to one another. Gates of the PMOS transistor 631 and the NMOS transistor 632 are connected to the node N611, and a gate of the NMOS transistor 633 is connected to the clock pulse signal CKP. The second latch 640 includes a second inverter 645, which is connected to the node N631, and PMOS transistors 641 and 642 and NMOS transistors 643 and 644, which are serially connected between a power supply voltage VDD and a ground voltage VSS. A gate of the PMOS transistor 641 is connected to an output of the second inverter 645, a gate of the PMOS transistor 642 is connected to the node N631, a gate of the NMOS transistor 643 is connected to the node N611, and a gate of the NMOS transistor 644 is connected to an output of the second inverter 645. A signal of the node N631 is connected to the first inverter 650 and output as an output signal QN.

As described above, since the node N631 is connected to the ground voltage VSS via two NMOS transistors 632 and 633, the 3-input AND gate 600 described above shortens the device switching time, as compared with a conventional device that employs the conventional flip-flop of FIG. 1.

FIG. 7 is a schematic diagram of a 3-input OR gate 700, to which the flip-flop 300 is applied. The 3-input OR gate 700 is the same as the 3-input AND gate 600 except that an input portion 710 is included instead of the input portion 610. To avoid duplicate explanation, only the input portion 710 will now be described.

The 3-input OR gate 700 performs an OR operation on the three input data A, B, and C received in response to the clock pulse signal CKP and generates an output signal QN. The input portion 710 includes three PMOS transistors 711, 712, and 713, which are serially connected to each other between a power supply voltage. VDD and a node N713, and 3 NMOS transistors 714, 715, and 716, which are connected in parallel to each other between the node N713 and a node N714. Gates of the PMOS transistor 711 and the NMOS transistor 714 are connected to the input data A. Gates of the PMOS transistor 712 and the NMOS transistor 715 are connected to the input data B. Gates of the PMOS transistor 713 and the NMOS transistor 716 are connected to the input data C.

FIG. 8 is a schematic diagram of a 4-input AOI gate 800, to which the flip-flop 300 of FIG. 3 is applied. The 4-input AOI gate 800 is the same as the 3-input AND gate 600 except that an input portion 810 is included instead of the input portion 610. To avoid duplicate explanation, only the input portion 810 will now be described.

The 4-input AOI gate 800 performs an AND-OR-INVERTING (AOI) operation on four input data A, B, C, and D in response to the clock pulse signal CKP and generates an output signal QN. The 4-input AOI gate 800 is typically used in a high speed adder. The input portion 810 includes serially-connected PMOS transistors 811 and 812 and serially connected PMOS transistors 815 and 816, which are connected between a power supply voltage VDD and a node N812, and serially-connected NMOS transistors 813 and 814 and serially-connected NMOS transistors 815 and 816, which are connected between the node N812 and a node N814. Gates of the PMOS transistor 812 and the NMOS transistor 813 are connected to the input data A. Gates of the PMOS transistor 816 and the NMOS transistor 814 are connected to the input data B. Gates of the PMOS transistor 811 and the NMOS transistor 817 are connected to the input data C. Gates of the PMOS transistor 815 and the NMOS transistor 818 are connected to the input data D.

Figure 9:
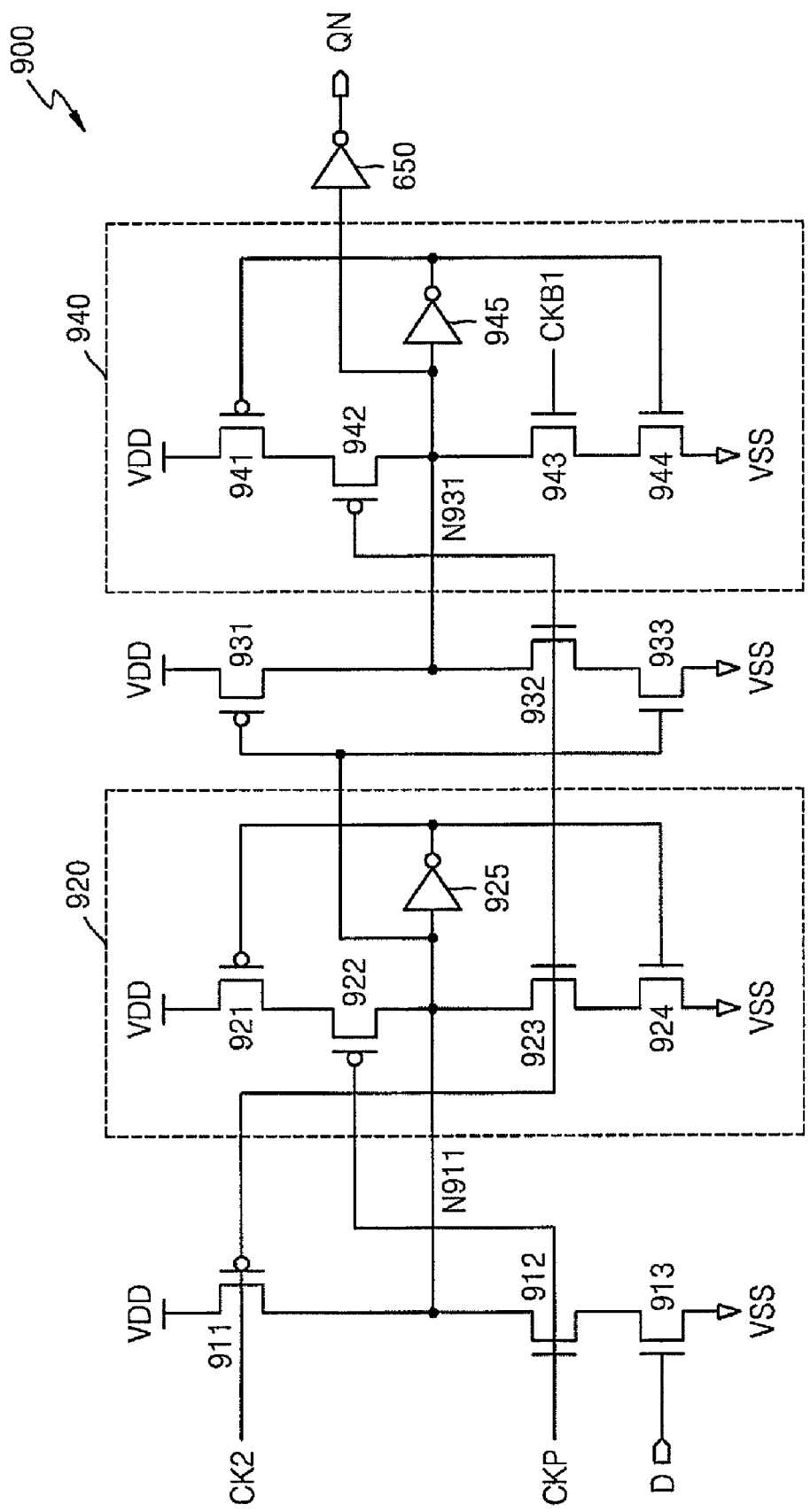
FIG. 9 is a schematic diagram of a flip-flop according to another embodiment of the present invention.

FIG. 9 is a schematic diagram of a flip-flop 900 according to another embodiment of the present invention. Referring to FIG. 9, the flip-flop 900 includes a PMOS transistor 911 and NMOS transistors 912 and 913, which are serially connected between a power supply voltage VDD and a ground voltage VSS. A gate of the PMOS transistor 911 is connected to the second clock signal CK2 (for example CK2 of FIG. 4A), a gate of the PMOS transistor 912 is connected to the clock pulse signal CKP, and a gate of the NMOS transistor 913 is connected to the input data D. The second clock signal CK2 and the clock pulse signal CKP are provided by the clock pulse generation circuit 400 of FIG. 4A. The logic level of a node N911 between the PMOS transistor 911 and the NMOS transistor 912 is maintained by a first latch 920.

The flip-flop 900 further includes a PMOS transistor 931 and NMOS transistors 932 and 933, which are serially connected between a power supply voltage VDD and a ground voltage VSS. Gates of the PMOS transistor 931 and the NMOS transistor 933 are connected to the node N911, and a gate of the NMOS transistor 932 is connected to the second clock signal CK2. The logic level of a node N931 between the PMOS transistor 931 and the NMOS transistor 932 is maintained by a second latch 940. A signal of the node N931 is connected to the first inverter 650 and output as an output signal QN.

The first latch 920 includes a second inverter 925, which is connected to the node N911, and PMOS transistors 921 and 922 and NMOS transistors 923 and 924, which are serially connected between a power supply voltage VDD and a ground voltage VSS. Gates of the PMOS transistor 921 and the NMOS transistor 924 are connected to an output of the second inverter 925, a gate of the PMOS transistor 922 is connected to the clock pulse signal CKP, and a gate of the NMOS transistor 923 is connected to the second clock signal CK2.

The second latch 940 includes a third inverter 945, which is connected to the node N931, and PMOS transistors 941 and 942 and NMOS transistors 943 and 944, which are serially connected between a power supply voltage VDD and a ground voltage VSS. Gates of the PMOS transistor 941 and the NMOS transistor 944 are connected to an output of the third inverter 945, a gate of the PMOS transistor 942 is connected to the second clock signal CK2, and a gate of the NMOS transistor 943 is connected to the first clock signal CKB1 (for example CKB1 of FIG. 4A).

Figure 10:
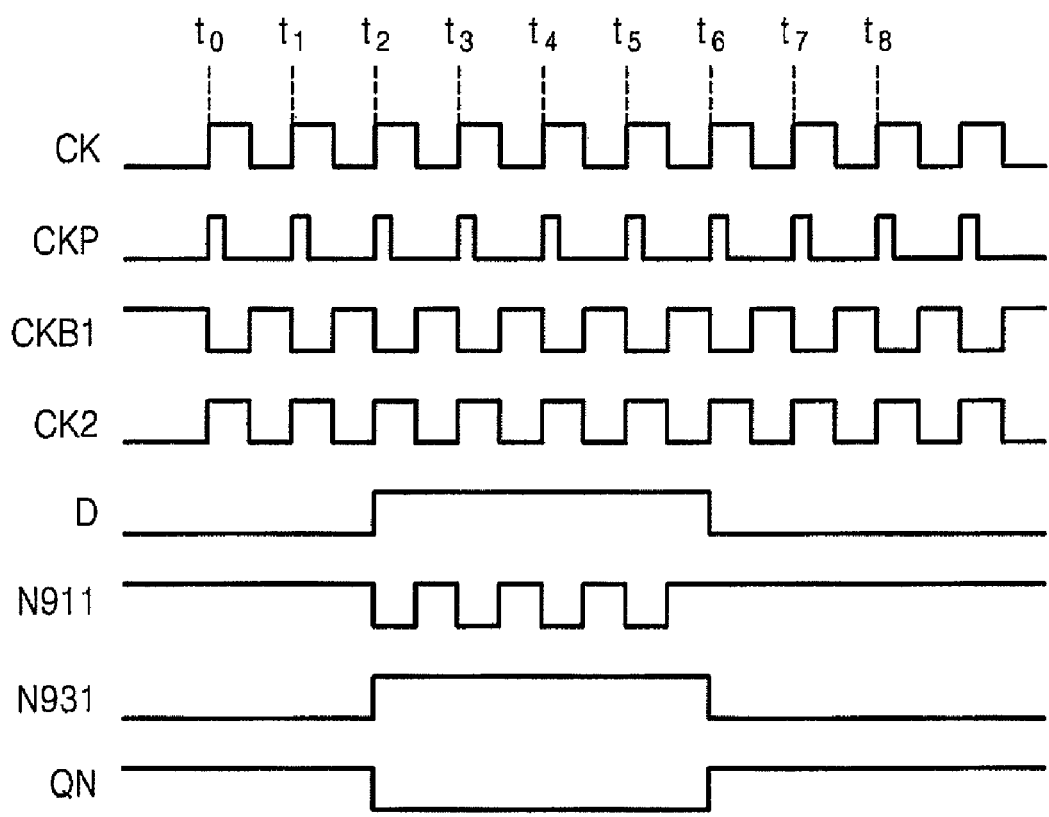
FIG. 10 is a timing diagram illustrating an operation of the flip-flop of FIG. 9.

FIG. 10 is a timing diagram that illustrates an operation of the flip-flop 900 of FIG. 9. Referring to FIG. 10, pulses of the clock pulse signal CKP are generated on rising edges of sequential clocks of the clock signal CK, and the second clock signal CK2 is generated in phase with the clock signal CK. At time t2, the input data D is transitioned from a logic low level to a logic high level. In response to a transition of the second clock signal CK2 from a logic low level to a logic high level, the PMOS transistor 911 is turned off. In response to a high level pulse of the clock pulse signal CKP, the NMOS transistor 912 is turned on. In response to the transition of the input data D to the logic high level, the NMOS transistor 913 is turned on, so the node N911 is transitioned from a logic high level to a logic low level. The logic low level of the node N911 is maintained constant by the NMOS transistors 923 and 924 that are turned on in response to the transition of the second clock signal CK2 to the high level and a high level output of the second inverter 925, respectively.

In response to the transition of the node N911 to the logic low level, the PMOS transistor 931 is turned on, so the node N931 is transitioned from a low logic level to a logic high level. At this time, the NMOS transistor 932 is turned on in response to a high level pulse of the second clock signal CK2, but the NMOS transistor 933 is turned off in response to the transition of the node N911 to the logic low level. The high level of the node N931 is maintained constant by both the PMOS transistor 941 being turned on in response to the high level output of the third inverter 945 and the PMOS transistor 942 being turned on in response to the high level pulse of the second clock signal CK2. A signal at the node N931 at the logic high level passes through the first inverter 650 and is output as an output signal QN at a logic low level.

The low level of the node N911 is transitioned to a high level by the PMOS transistor 911 being turned on in response to a transition of the second clock signal CK2 from the high level to a low level. At this time, although the NMOS transistor 913 is still turned on, the NMOS transistor 912 is turned off in response to a low level pulse of the clock pulse signal CKP, and accordingly, the node N911 is kept at a logic high level. The high level of the node N911 is maintained constant because of both the PMOS transistor 921 being turned on in response to the low level output of the second inverter 925 and the PMOS transistor 922 being turned on in response to a low level pulse of the clock pulse signal CKP. Through a repetition of such operation, the level of the signal at node N911 is toggled depending on the logic level of the second clock signal CK2 while the input data D remains at a logic high level.

At time t6, the logic high level of the input data D is transitioned to a logic low level. In response to the transition of the input data D to the logic low level, the NMOS transistor 913 is turned off. In response to a high level pulse of the second clock signal CK2, the PMOS transistor 911 is turned on. Hence, the node N911 is transitioned from the low level to the high level. The logic high level of the node N911 is maintained because of both the PMOS transistor 921 being turned on in response to the low level output of the second inverter 925 and the PMOS transistor 922 being turned on in response to a low level pulse of the clock pulse signal CKP.

The PMOS transistor 931 is turned off in response to the transition of the input data D to the low level, the NMOS transistor 932 is turned on in response to a high level pulse of the node N911, and the NMOS transistor 933 is turned on in response to the transition of the input data D to the low level. Hence, the logic high level of the node N931 is transitioned to the logic low level. The logic low level of the node N931 is maintained constant because of both the NMOS transistor 944 being turned on in response to the high level output of the third inverter 945 and the NMOS transistor 943 being turned on in response to a high level pulse of the first clock signal CKB1. A signal at the node N931 at the logic low level passes through the first inverter 650 and is output as an output signal QN at a logic high level.

In the flip-flop 900, a signal pathway between the node N911, which is an intermediate node, and the ground voltage VSS is formed by two transistors, which are the NMOS transistors 912 and 913. Also, the signal path between the node N931, which is an intermediate node, to the ground voltage VSS is likewise formed by two transistors, which are the NMOS transistors 932 and 933. Hence, the flip-flop 900 shortens the switching time of the device, as compared to the conventional flip-flop 100 of FIG. 1 by 30% or more, as described above. Since the logic level of the node N911 is toggled while the input data D is in a logic high level, the flip-flop 900 is referred to as a dynamic flip-flop.

Figure 11:
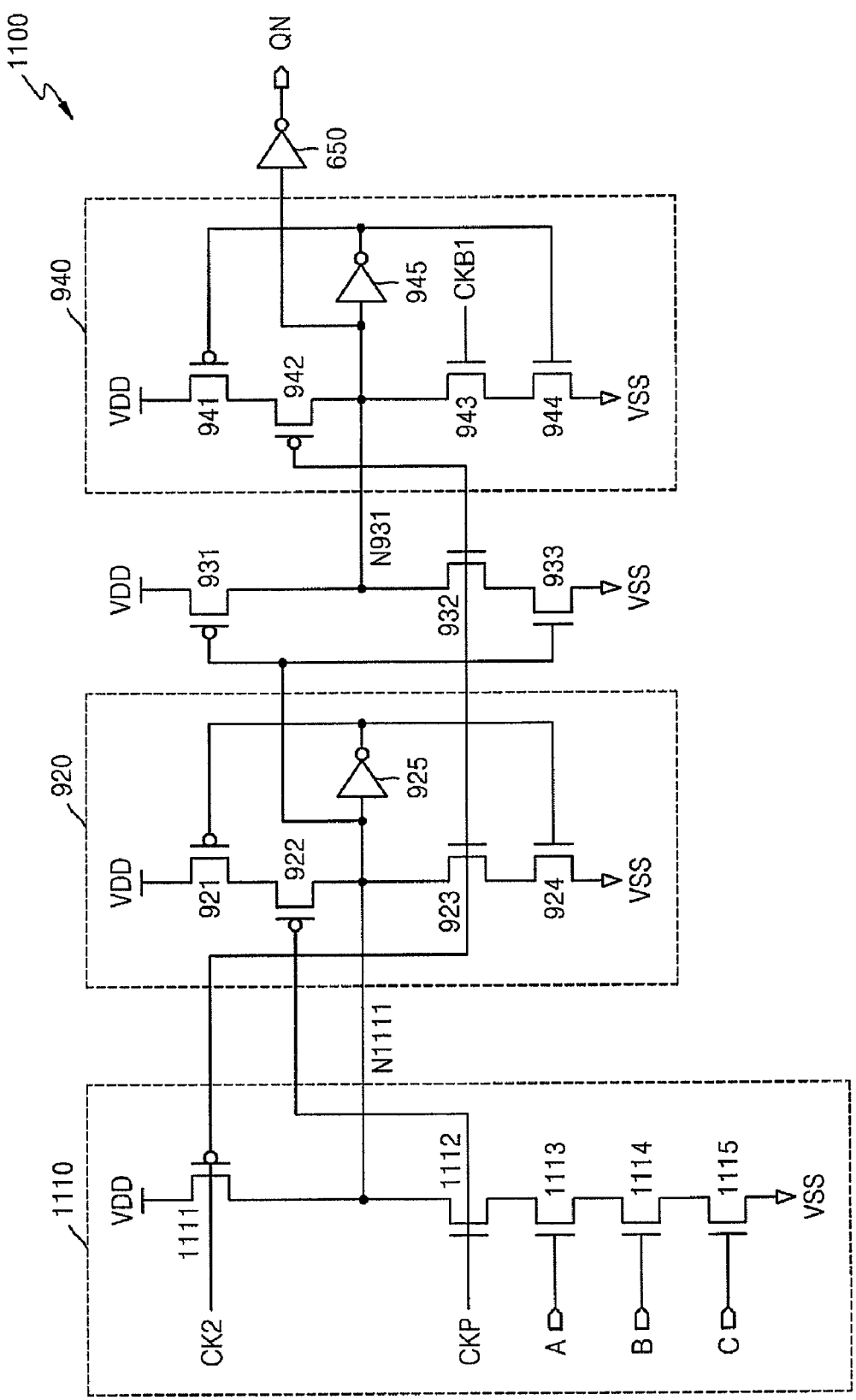
FIG. 11 is a schematic diagram of a 3-input AND gate using the flip-flop of FIG. 9.

Complex gates that employ the flip-flop 900 of FIG. 9 are illustrated in FIGS. 11 through 15. FIG. 11 is a schematic diagram of a 3-input AND gate 1100, which performs an AND operation on three input data A, B, and C in response to the second clock signal CK2 and the clock pulse signal CKP and generates the output signal QN. The 3-input AND gate 1100 includes an input portion 1110, the first and second latches 920 and 940, the transistors 931, 932, and 933, and the first inverter 650. Since the structure and operation of the first and second latches 920 and 940, the transistors 931, 932, and 933, and the first inverter 650 are the same as those of the flip-flop 900, a description thereof will be omitted.

The input portion 1110 includes a PMOS transistor 1111 and four NMOS transistors 1112, 1113, 1114, and 1115, which are serially connected to each other between a power supply voltage VDD and a ground voltage VSS. A gate of the PMOS transistor 1111 is connected to the second clock signal CK2. A gate of the NMOS transistor 1112 is connected to the clock pulse signal CKP. A gate of the NMOS transistor 1113 is connected to the input data A. A gate of the NMOS transistor 1114 is connected to the input data B. A gate of the NMOS transistor 1115 is connected to the input data C. A node N111 between the PMOS transistor 1111 and the NMOS transistor 1112 is connected to the first latch 920 and maintains its logic level at a constant level.

Figure 12:
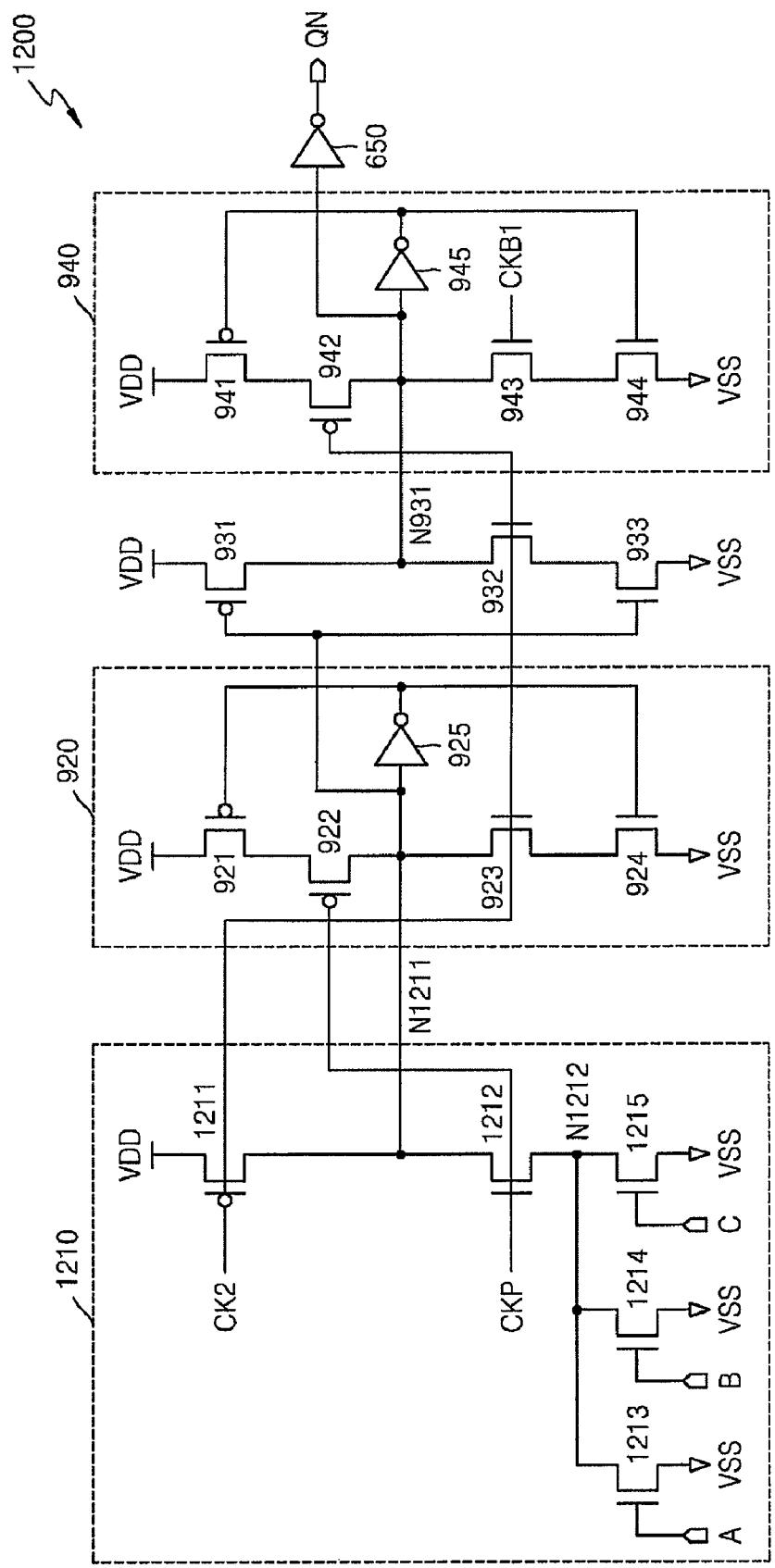
FIG. 12 is a schematic diagram of an example of a 3-input OR gate using the flip-flop of FIG. 9.

FIG. 12 is a schematic diagram of an example of a 3-input OR gate 1200. The 3-input OR gate 1200 performs an OR operation on the three input data A, B, and C in response to the second clock signal CK2 and the clock pulse signal CKP and generates the output signal QN. Since the 3-input OR gate 1200 includes the same elements as those of the flip-flop 900 except that an input portion 1210 is included, only the input portion 1210 will now be described.

The input portion 1210 includes a PMOS transistor 1211 and an NMOS transistor 1212, which are serially connected to each other between a power supply voltage VDD and a node N1212, and three NMOS transistors 1213, 1214, and 1215, which are connected in parallel to each other between the node N1212 and a ground voltage VSS. A gate of the PMOS transistor 1211 is connected to the second clock signal CK2. A gate of the NMOS transistor 1212 is connected to the clock pulse signal CKP. A gate of the NMOS transistor 1213 is connected to the input data A. A gate of the NMOS transistor 1214 is connected to the input data B. A gate of the NMOS transistor 1215 is connected to the input data C. A node N1211 between the PMOS transistor 1211 and the NMOS transistor 1212 is connected to the first latch 920 and maintains its logic level constant.

Figure 13:
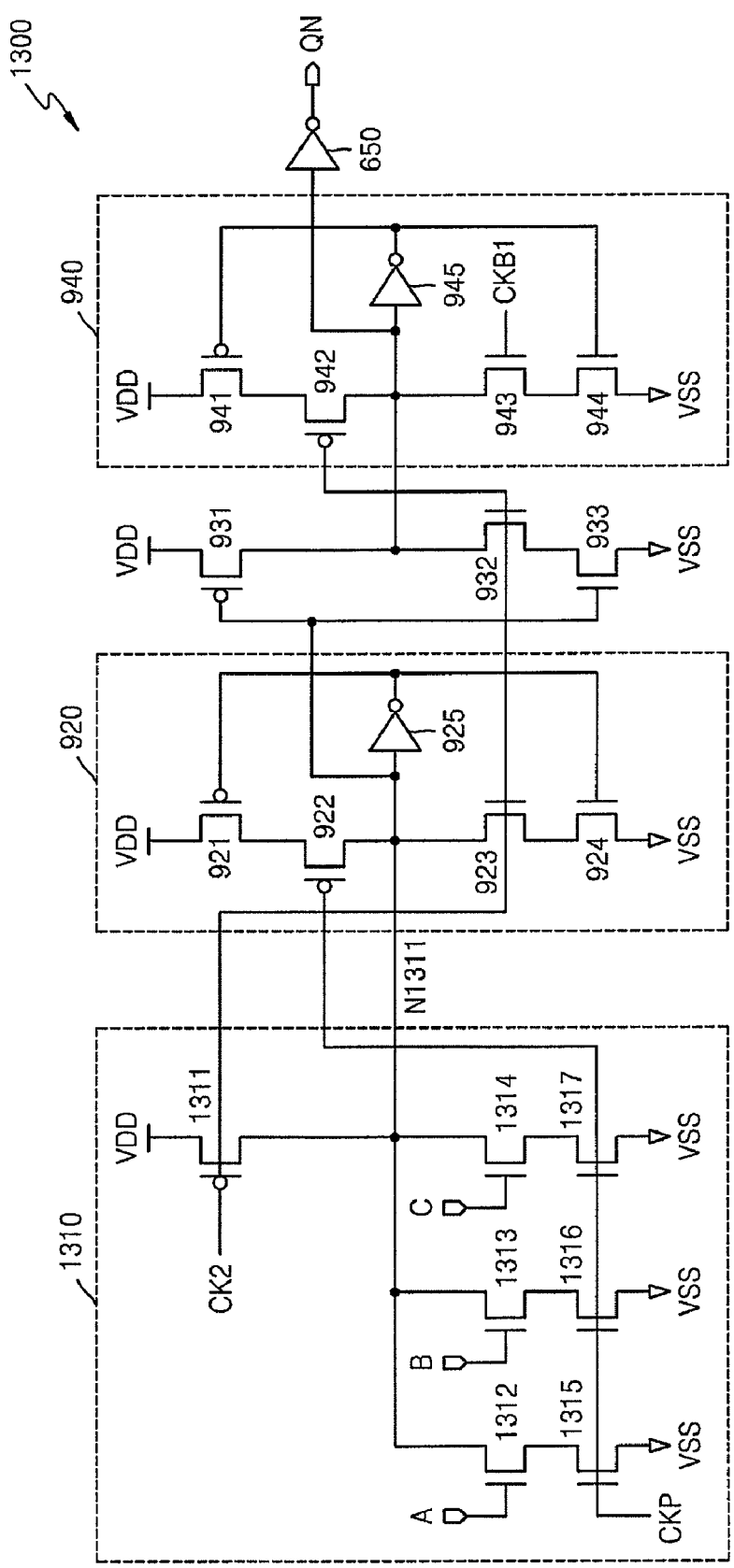
FIG. 13 is a schematic diagram of another example of a 3-input OR gate using the flip-flop of FIG. 9.

FIG. 13 is a schematic diagram of another example of a 3-input OR gate 1300. The-input OR gate 1300 performs an OR operation on the three input data A, B, and C in response to the second clock signal CK2 and the clock pulse signal CKP and generates the output signal QN. Since the 3-input OR gate 1300 includes the same elements as those of the flip-flop 900 except that an input portion 1310 is included, only the input portion 1310 will now be described.

The input portion 1310 includes a PMOS transistor 1311, which is connected a power supply voltage VDD and a node N1311, and serially connected NMOS transistors 1312 and 1315, serially connected NMOS transistors 1313 and 1316, and serially connected NMOS transistors 1314 and 1317, which are connected between the node N1311 and a ground voltage VSS. A gate of the PMOS transistor 1311 is connected to the second clock signal CK2. A gate of the NMOS transistor 1312 is connected to the input data A. A gate of the NMOS transistor 1313 is connected to the input data B. A gate of the NMOS transistor 1314 is connected to the input data C. Gates of the NMOS transistors 1315, 1316, and 1317 are connected to the clock pulse signal CKP. A node N1311 between the PMOS transistor 1311 and each of the NMOS transistors 1312, 1313, and 1314 is connected to the first latch 920 and maintains its logic level at a constant level.

Figure 14:
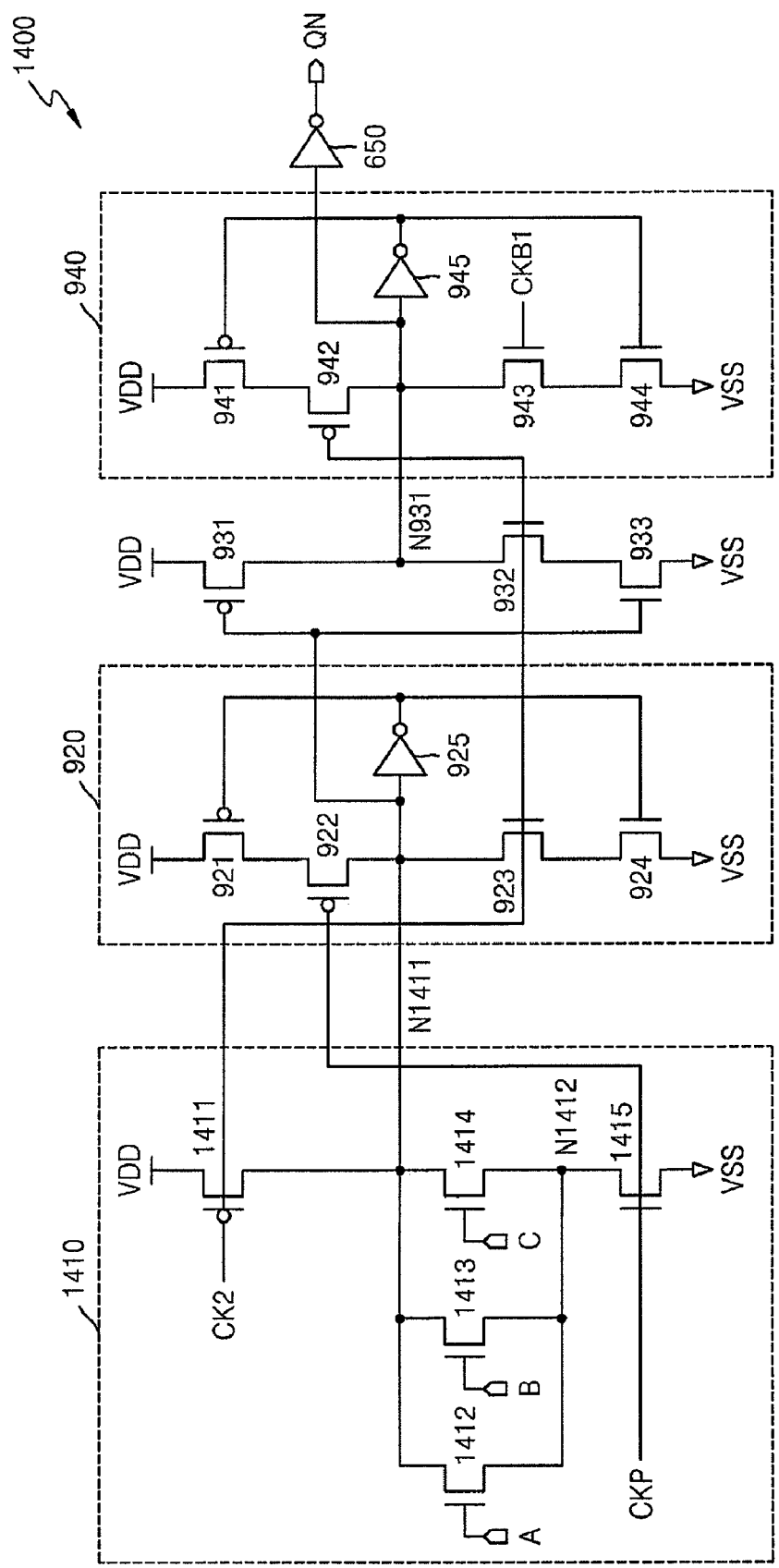
FIG. 14 is a schematic diagram of still another example of a 3-input OR gate using the flip-flop of FIG. 9.

FIG. 14 is a schematic diagram of still another example of a 3-input OR gate 1400. The 3-input OR gate 1400 performs an OR operation on the three input data A, B, and C in response to the second clock signal CK2 and the clock pulse signal CKP and generates the output signal QN. Since the 3-input OR gate 1400 includes the same elements as those of the flip-flop 900 except that an input portion 1410 is included, only the input portion 1410 will now be described.

The input portion 1410 includes a PMOS transistor 1411, which is connected between a power supply voltage VDD and a node N1411, and three NMOS transistors 1412, 1413, and 1414, which are connected in parallel to each other between the node N1411 and a node 1412, and an NMOS transistor 1415, which is connected between the node 1412 and a ground voltage VSS. A gate of the PMOS transistor 1411 is connected to the second clock signal CK2. A gate of the NMOS transistor 1412 is connected to the input data A. A gate of the NMOS transistor 1413 is connected to the input data B. A gate of the NMOS transistor 1414 is connected to the input data C. A gate of the NMOS transistor 1415 is connected to the clock pulse signal CKP. A node N1411 between the PMOS transistor 1411 and each of the NMOS transistors 1412, 1413, and 1414 is connected to the first latch 920 and maintains its logic level at a constant level.

Figure 15:
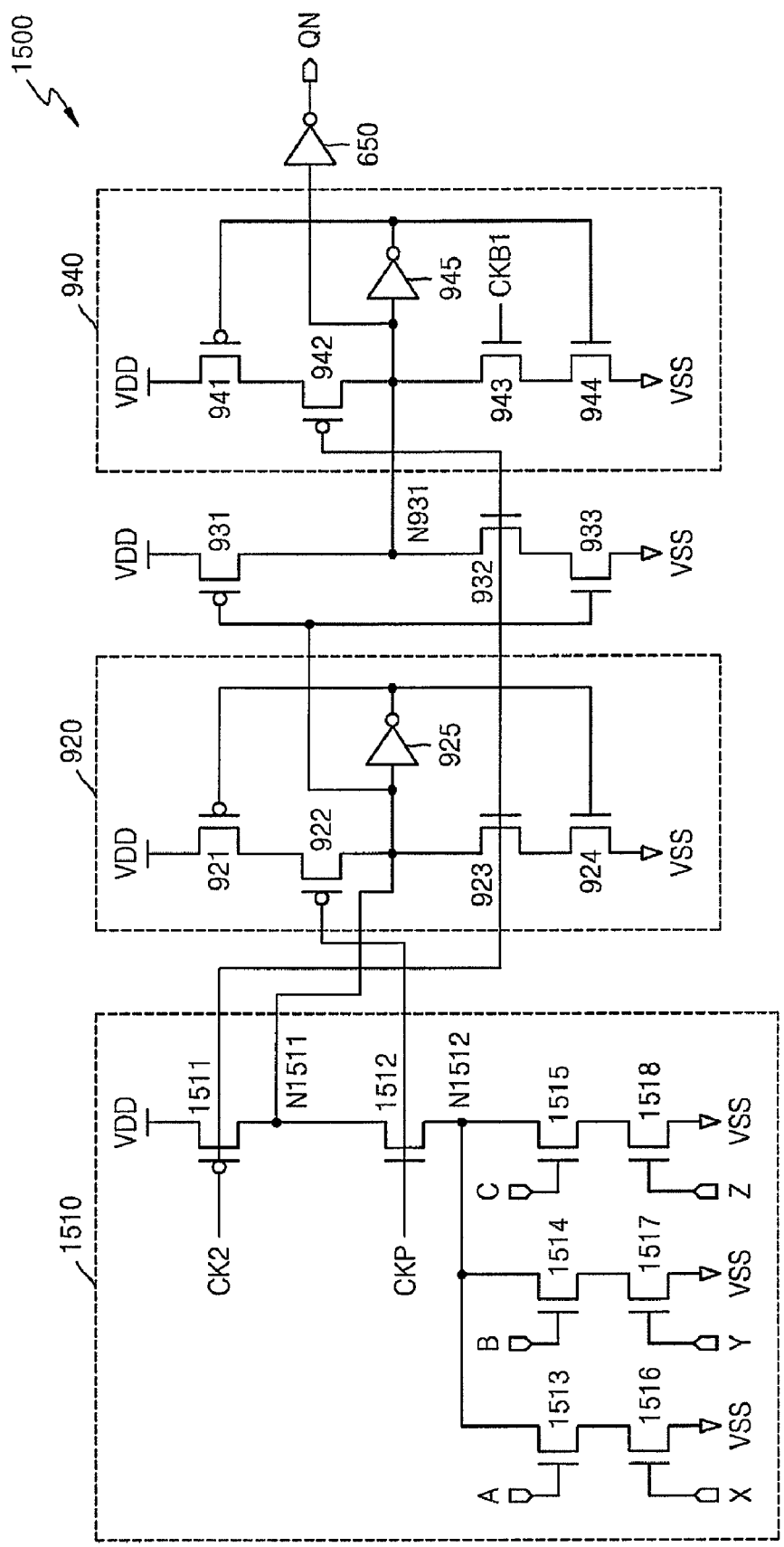
FIG. 15 is a schematic diagram of a 6-input AOI gate using the flip-flop of FIG. 9.

FIG. 15 is a schematic diagram of a 6-input AOI gate 1500. The 6-input AOI gate 1500 performs an AOI operation on six input data A, B, C, X, Y, and Z in response to the second clock signal CK2 and the clock pulse signal CKP and generates an output signal QN. Since the 6-input AOI gate 1500 includes the same elements as those of the flip-flop 900 except that an input portion 1510 is included, only the input portion 1510 will now be described.

The input portion 1510 includes a PMOS transistor 1511 and an NMOS transistor 1512, which are serially connected between a power supply voltage VDD and a node N1512, and serially connected NMOS transistors 1513 and 1516, serially connected NMOS transistors 1514 and 1517, and serially connected NMOS transistors 1515 and 1518, which are connected between the node N1512 and a ground voltage VSS. A gate of the PMOS transistor 1511 is connected to the second clock signal CK2. A gate of the NMOS transistor 1512 is connected to the clock pulse signal CKP. A gate of the NMOS transistor 1513 is connected to the input data A. A gate of the NMOS transistor 1514 is connected to the input data B. A gate of the NMOS transistor 1515 is connected to the input data C. A gate of the NMOS transistor 1516 is connected to the input data X. A gate of the NMOS transistor 1517 is connected to the input data Y. A gate of the NMOS transistor 1518 is connected to the input data Z. A node N1511 between the PMOS transistor 1511 and the NMOS transistor 1512 is connected to the first latch 920 and maintains its logic level at a constant level.

Figure 16:
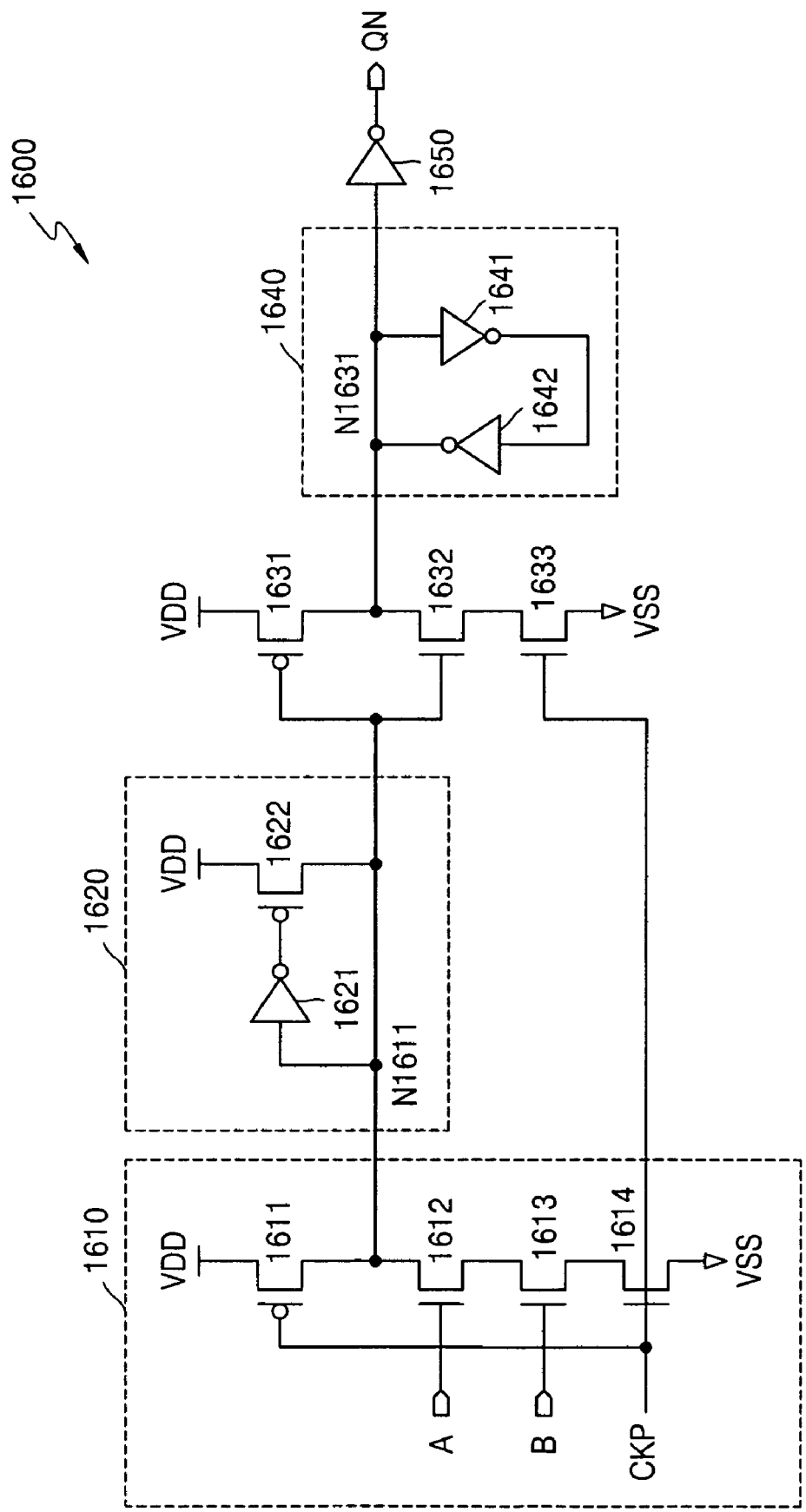
FIG. 16 is a schematic diagram of a simplified 2-input AND gate.
Figure 17:
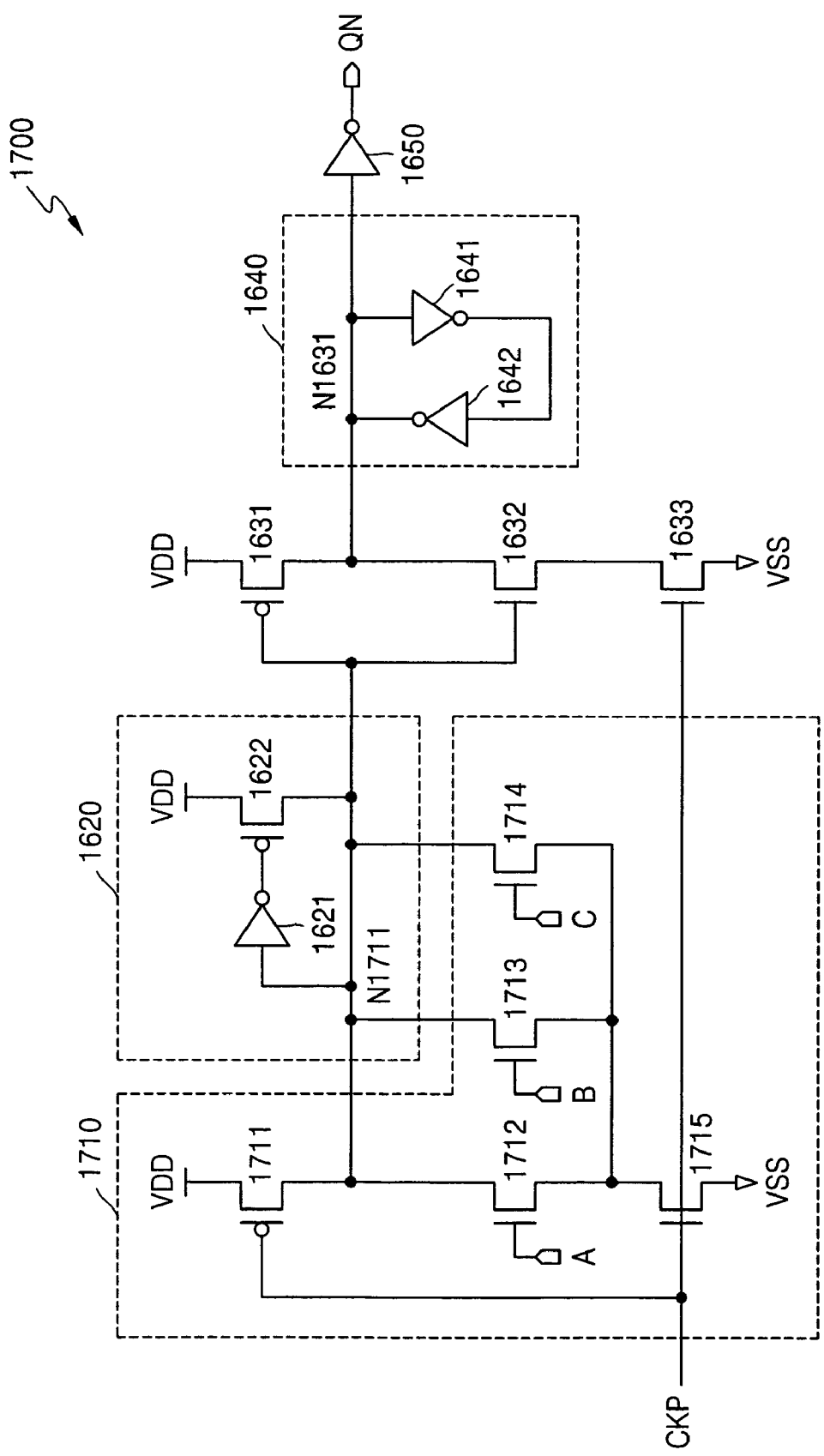
FIG. 17 is a schematic diagram of a simplified 3-input OR gate.
Figure 18:
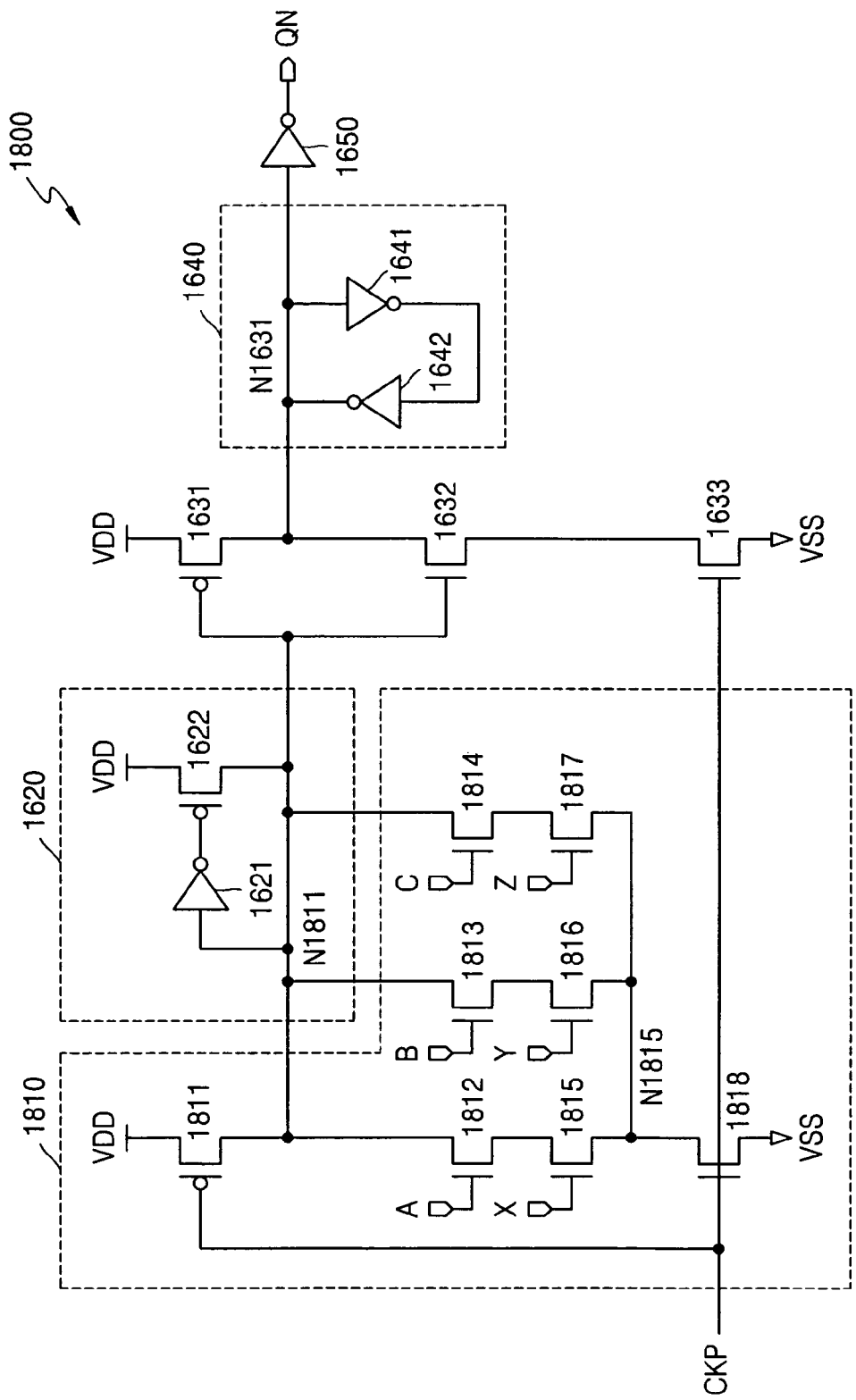
FIG. 18 is a schematic diagram of a simplified 6-input AOI gate.

Complex gates simpler than the above-described complex gates are illustrated in FIGS. 16 through 18. FIG. 16 is a schematic diagram of a simple 2-input AND gate 1600, which performs an AND operation on two input data A and B in response to the clock pulse signal CKP and generates an output signal QN. The 2-input AND gate 1600 includes an input portion 1610, first and second latches 1620 and 1640, transistors 1631, 1632, and 1633, and a first inverter 1650.

The input portion 1610 includes four transistors 1611, 1612, 1613, and 1614 which are serially connected to each other between a power supply voltage VDD and a ground voltage VSS. A gate of the PMOS transistor 1611 is connected to the clock pulse signal CKP, a gate of the NMOS transistor 1612 is connected to the input data A. A gate of the NMOS transistor 1613 is connected to the input data B. A gate of the NMOS transistor 1614 is connected to the clock pulse signal CKP.

The first latch 1620 latches a logic level of a node N1611 between the PMOS transistor 1611 and the NMOS transistor 1612. The first latch 1620 includes a second inverter 1621, which receives the node N1611, and an NMOS transistor 1622, which is gated to an output of the second inverter 1621. The first latch 1620 holds and maintains the logic level of the node N1611.

Transistors 1631, 1632, and 1633 are serially connected between a power supply voltage VDD and a ground voltage VSS. Gates of the PMOS transistor 1631 and the NMOS transistor 1632 are connected to the node N1611, and a gate of the NMOS transistor 1633 is connected to the clock pulse signal CKP.

The second latch 1640 includes third and fourth inverters 1641 and 1642, which latch a node N1631 between the PMOS transistor 1631 and the NMOS transistor 1632. The second latch 1640 holds and maintains a logic level of the node N1631. A signal at the node N1631 passes through the first inverter 1650 and is output as the output signal QN.

FIG. 17 is a schematic diagram of a simple 3-input OR gate 1700. The 3-input OR gate 1700 performs an OR operation on the three input data A, B, and C in response to the clock pulse signal CKP and generates an output signal QN. The 3-input OR gate 1700 is the same as the 2-input AND gate 1600 except that an input portion 1710 is included instead of the input portion 1610. To avoid duplicate explanation, only the input portion 1710 will now be described.

The input portion 1710 includes a PMOS transistor 1711, which is connected between a power supply voltage VDD and a node N1711, and three NMOS transistors 1712, 1713, and 1714, which are connected in parallel to each other between the node N1711 and a first terminal of an NMOS transistor 1715. The second terminal of the NMOS transistor 1715 is connected to a ground voltage VSS. A gate of the PMOS transistor 1711 is connected to the clock pulse signal CKP. A gate of the NMOS transistor 1712 is connected to the input data A. A gate of the NMOS transistor 1713 is connected to the input data B. A gate of the NMOS transistor 1714 is connected to the input data C. A gate of the NMOS transistor 1715 is connected to the clock pulse signal CKP. A logic level of the node N1711 is held and maintained by the first latch 1620.

FIG. 18 is a schematic diagram of a 6-input AOI gate 1800. The 6-input AOI gate 1800 performs an AOI operation on six input data A, B, C, X, Y, and Z in response to the clock pulse signal CKP and generates an output signal QN. Since the 6-input AOI gate 1800 includes the same elements as the 2-input AND gate 1600 except that an input portion 1810 is included, only the input portion 1810 will now be described.

The input portion 1810 includes a PMOS transistor 1811, which is connected between a power supply voltage VDD and a node N1811, transistors 1812 through 1817, which are connected between the node N1811 and a node N1815, and an NMOS transistor 1818, which is connected between the node N1815 and a ground voltage VSS. The NMOS transistors 1812 and 1815 are serially connected to each other, the NMOS transistors 1813 and 1816 are serially connected to each other, and the NMOS transistors 1814 and 1817 are serially connected to each other. A gate of the PMOS transistor 1811 is connected to the clock pulse signal CKP. A gate of the NMOS transistor 1812 is connected to the input data A. A gate of the NMOS transistor 1813 is connected to the input data B. A gate of the NMOS transistor 1814 is connected to the input data C. A gate of the NMOS transistor 1815 is connected to the input data X. A gate of the NMOS transistor 1816 is connected to the input data Y. A gate of the NMOS transistor 1817 is connected to the input data Z. A gate of the NMOS transistor 1818 is connected to the clock pulse signal CKP. A logic level of the node N1811 between the PMOS transistor 1811 and the NMOS transistor 1812 is held and maintained by the first latch 1620.

Figure 19:
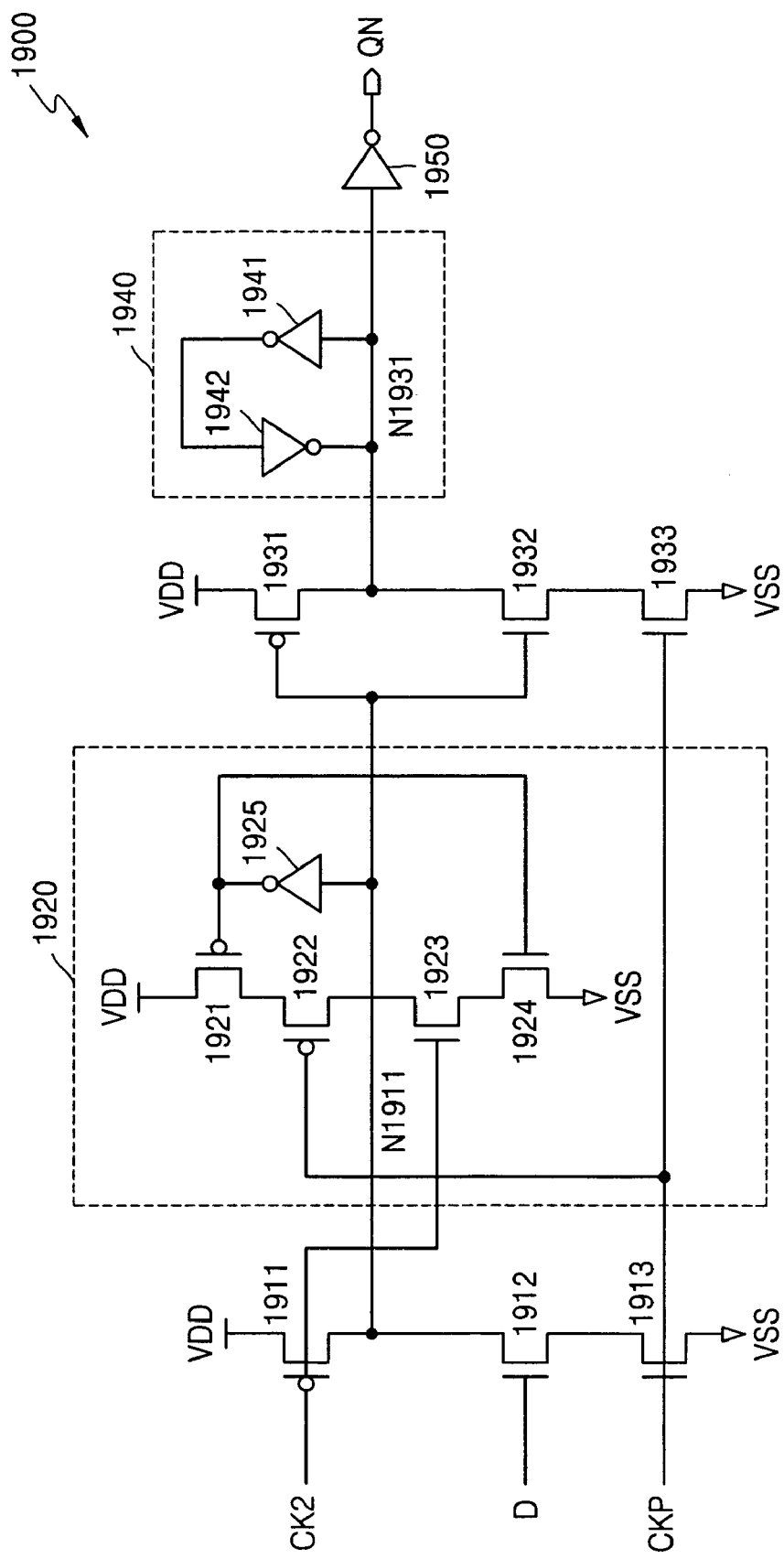
FIG. 19 is a schematic diagram of a flip-flop according to still another embodiment of the present invention.

FIG. 19 is a schematic diagram of a flip-flop 1900 according to still another embodiment of the present invention. Referring to FIG. 19, the flip-flop 1900 includes a PMOS transistor 1911 and NMOS transistors 1912 and 1913, which are serially connected between a power supply voltage VDD and a ground voltage VSS. A gate of the PMOS transistor 1911 is connected to the second clock signal CK2, a gate of the NMOS transistor 1912 is connected to the input data D, and a gate of the NMOS transistor 1913 is connected to the clock pulse signal CKP. A node N1911 between the PMOS transistor 1911 and the NMOS transistor 1912 is connected to a first latch 1920.

The flip-flop 1900 further includes a PMOS transistor 1931 and NMOS transistors 1932 and 1933, which are serially connected between a power supply voltage VDD and a ground voltage VSS. Gates of the PMOS transistor 1931 and the NMOS transistor 1932 are connected to the node N1911, and a gate of the NMOS transistor 1933 is connected to the clock pulse signal CKP. A node N1931 between the PMOS transistor 1931 and the NMOS transistor 1932 is connected to a second latch 1940. A signal at the node N1931 passes through a first inverter 1950 and is output as an output signal QN.

The first latch 1920 includes a second inverter 1925, which is connected to the node N1911, and PMOS transistors 1921 and 1922 and NMOS transistors 1923 and 1924, which are serially connected between a power supply voltage VDD and a ground voltage VSS. A gate of the PMOS transistor 1921 is connected to an output of the second inverter 1925, a gate of the PMOS transistor 1922 is connected to the clock pulse signal CKP, a gate of the NMOS transistor 1923 is connected to the second clock signal CK2, and a gate of the NMOS transistor 1924 is connected to the clock pulse signal CKP. The second latch 1940 includes a third inverter 1941, which is connected to the node N1931, and a fourth inverter 1942, which is connected to an output of the third inverter 1941 and has an output connected to the node N1931.

Figure 20:
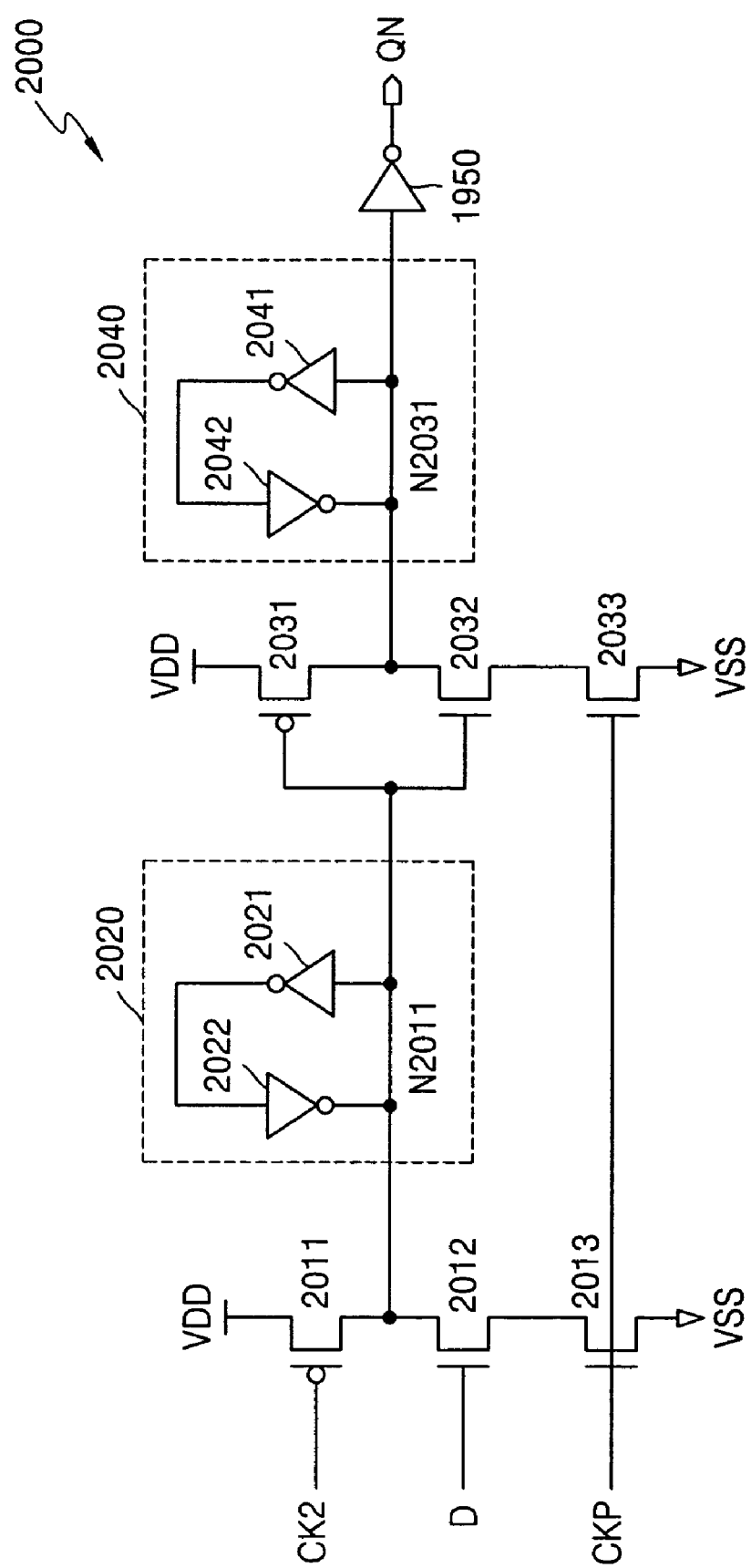
FIG. 20 is a schematic diagram of a flip-flop according to yet another embodiment of the present invention.

FIG. 20 is a schematic diagram of a flip-flop 2000 according to yet another embodiment of the present invention. Referring to FIG. 20, the flip-flop 2000 includes a PMOS transistor 2011 and NMOS transistors 2012 and 2013, which are serially connected between a power supply voltage VDD and a ground voltage VSS. A gate of the PMOS transistor 2011 is connected to the second clock signal CK2, a gate of the NMOS transistor 2012 is connected to the input data D, and a gate of the NMOS transistor 2013 is connected to the clock pulse signal CKP. A node N2011 between the PMOS transistor 2011 and the NMOS transistor 2012 is connected to a first latch 2020.

The flip-flop 2000 further includes a PMOS transistor 2031 and NMOS transistors 2032 and 2033, which are serially connected between a power supply voltage VDD and a ground voltage VSS. Gates of the PMOS transistor 2031 and the NMOS transistor 2032 are connected to the node N2011, and a gate of the NMOS transistor 2033 is connected to the clock pulse signal CKP. A node N2031 between the PMOS transistor 2031 and the NMOS transistor 2032 is connected to a second latch 2040. A signal at the node N2031 passes through a first inverter 2050 and is output as an output signal QN.

The first latch 2020 includes a second inverter 2021, which is connected to the node N2011, and a third inverter 2022, which is connected to an output of the second inverter 2021 and has an output connected to the node N2031. The second latch 2040 includes a fourth inverter 2041, which is connected to the node N2031, and a fifth inverter 2042, which is connected to an output of the fourth inverter 2041 and has an output connected to the node N2031.

Figure 21:
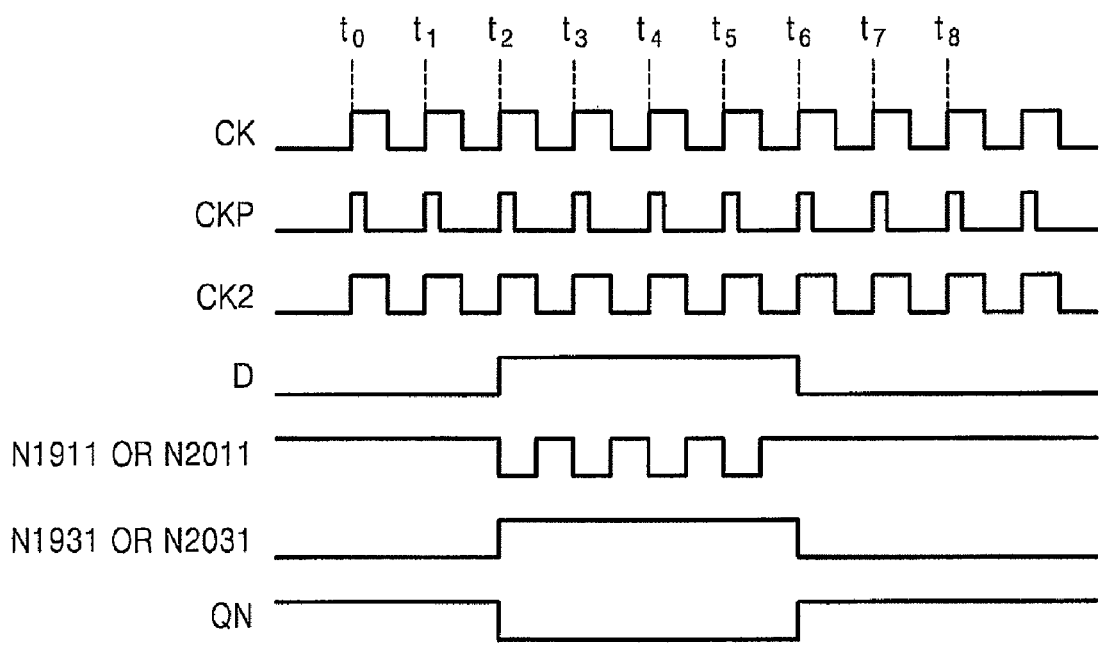
FIG. 21 is a timing diagram illustrating operations of the flip-flops of FIGS. 9 and 10.

Operations of the flip-flops 1900 and 2000 are described with reference to the timing diagram of FIG. 21. Referring to FIG. 21, clock pulses of the clock signal CK are generated, high level pulses of the clock pulse signal CKP are generated on rising edges of the clock signal CK, and the second clock signal CK2 is generated in response to the clock signal CK. At time t2, when the input data D is transitioned from a logic low level to a logic high level, the nodes N11911 and N2011, which are first intermediate nodes, are transitioned from high levels to low levels, the nodes N1931 and N2031, which are second intermediate nodes, are transitioned from low levels to high levels, and the output signal QN is transitioned from a logic high level to a logic low level. Thereafter, logic levels of the nodes N1911 and N2011 are toggled according to the toggling of the second clock signal CK2. At time t6, when the logic high level of the input data D is transitioned to a logic low level, the low levels of the nodes N1911 and N2011 are transitioned to the high levels, the high levels of the nodes N1931 and N2031 are transitioned to the low levels, and the logic low level of the output signal QN is transitioned to the logic high level.

Since the logic levels of the nodes N1911 and N2011 are toggled while the input data D is in a logic high level, the flip-flops 1900 and 2000 are referred to as dynamic flip-flops.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A flip-flop comprising:
   a first PMOS transistor having a source to which a power supply voltage is connected and a gate to which input data is applied;
   a second NMOS transistor having a drain to which a drain of the first PMOS transistor is connected and a gate to which the input data is applied;
   a third NMOS transistor having a drain to which a source of the second NMOS transistor is directly connected, a gate to which a clock pulse signal is applied, and a source to which a ground voltage is directly connected;
   a first latch latching a logic level of a first node between the first PMOS transistor and the second NMOS transistor and a level of a second node between the second and third NMOS transistors in response to the clock pulse signal;
   a fourth PMOS transistor having a source to which the power supply voltage is connected and a gate to which the first node is connected;
   a fifth NMOS transistor having a drain to which a drain of the fourth PMOS transistor is directly connected and a gate to which the first node is directly connected;
   a sixth NMOS transistor having a drain to which a source of the fifth NMOS transistor is directly connected, a gate to which the clock pulse signal is connected, and a source to which the ground voltage is directly connected; and
   a second latch latching a logic level of a third node between the fourth PMOS transistor and the fifth NMOS transistor, the third node being connected to an input of the first latch to control an operation thereof, wherein a signal path is provided from the third node to the ground voltage, the signal path including the sixth NMOS transistor directly connected to the ground voltage, wherein the first latch comprises:
   a seventh PMOS transistor having a source to which the power supply voltage is connected and a gate to which the third node is connected;
   an eighth PMOS transistor having a source to which a drain of the seventh PMOS transistor is connected, a gate to which the clock pulse signal is connected, and a drain to which the first node is connected; and
   a ninth NMOS transistor having a drain to which the second node is connected, a gate to which the third node is connected, and a source to which the ground voltage is connected.

2. The flip-flop of claim 1, wherein:
   the clock pulse signal is generated from a clock signal by a clock pulse generation circuit; and
   the clock pulse generation circuit comprises:
   first, second and third inverters receiving a clock signal and being serially connected to one another;
   a NAND gate receiving the clock signal and an output of the third inverter; and a fourth inverter receiving an output of the NAND gate and generating the clock pulse signal.

3. The flip-flop of claim 1, wherein:
the clock pulse signal is generated from a clock signal by a clock pulse generation circuit; and
the clock pulse generation circuit comprises:
  a NAND gate receiving the clock signal and a signal applied to a fourth node;
  a first inverter receiving an output of the NAND gate and outputting the clock pulse signal;
  a tenth PMOS transistor having a source to which the power supply voltage is connected, a gate to which the clock signal is connected, and a drain to which the fourth node is connected;
  an eleventh NMOS transistor having a drain to which the fourth node is connected, a gate to which the clock pulse signal is connected, and a source to which the ground voltage is connected;
  a second inverter receiving the fourth node;
  a twelfth NMOS transistor having a drain to which the fourth node is connected and a gate to which the clock signal is connected; and
  a thirteenth NMOS transistor having a drain to which a source of the twelfth NMOS transistor is connected, a gate to which an output of the second inverter is connected, and a source to which the ground voltage is connected.

4. The flip-flop of claim 1, wherein:
the clock pulse signal is generated from a clock signal by a clock pulse generation circuit; and
the clock pulse generation circuit comprises:
  first, second and third inverters receiving a clock signal and being serially connected to one another;
  a NAND gate receiving the clock signal, an enable signal, and an output of the third inverter; and
  a fourth inverter receiving an output of the NAND gate and generating the clock pulse signal.

5. The flip-flop of claim 1, wherein:
the clock pulse signal is generated from a clock signal by a clock pulse generation circuit; and
the clock pulse generation circuit comprises:
  a NAND gate receiving the clock signal, an enable signal, and a signal applied to a fourth node;
  a first inverter receiving an output of the NAND gate and outputting the clock pulse signal;
  a tenth PMOS transistor having a source to which the power supply voltage is connected, a gate to which the clock signal is connected, and a drain to which the fourth node is connected;
  an eleventh NMOS transistor having a drain to which the fourth node is connected, a gate to which the clock pulse signal is connected, and a source to which the ground voltage is connected;
  a second inverter receiving the fourth node;
  a twelfth NMOS transistor having a drain to which the fourth node is connected and a gate to which the clock signal is connected; and
  a thirteenth NMOS transistor having a drain to which a source of the twelfth NMOS transistor is connected, a gate to which an output of the second inverter is connected, and a source to which the ground voltage is connected.

6. The flip-flop of claim 1, wherein the second latch comprises:
  an inverter connected to the third node;
  a tenth PMOS transistor having a source to which the power supply voltage is connected and a gate to which an output of the inverter is connected;
  an eleventh PMOS transistor having a source to which a drain of the tenth PMOS transistor is connected, a gate to which the third node is connected, and a drain to which the third node is connected;
  a twelfth NMOS transistor having a drain to which the third node is connected and a gate to which the first node is connected; and
  a thirteenth NMOS transistor having a drain to which a source of the twelfth NMOS transistor is connected, a gate to which an output of the inverter is connected, and a source to which the ground voltage is connected.

7. A flip-flop comprising:
  a first PMOS transistor having a source to which a power supply voltage is connected and a gate to which input data is applied;
  a second NMOS transistor having a drain to which a drain of the first PMOS transistor is connected and a gate to which the input data is applied;
  a third NMOS transistor having a drain to which a source of the second NMOS transistor is directly connected, a gate to which a clock pulse signal is applied, and a source to which a ground voltage is directly connected;
  a first latch latching a logic level of a first node between the first PMOS transistor and the second NMOS transistor and a logic level of a second node between the second and third NMOS transistors in response to the clock pulse signal;
  a fourth PMOS transistor having a source to which the power supply voltage is connected and a gate to which the first node is connected;
  a fifth NMOS transistor having a drain to which a drain of the fourth PMOS transistor is directly connected and a gate to which the clock pulse signal is directly connected;
  a sixth NMOS transistor having a drain to which a source of the fifth NMOS transistor is directly connected, a gate to which the first node is connected, and a source to which the ground voltage is directly connected; and
  a second latch latching a logic level of a third node between the fourth PMOS transistor and the fifth NMOS transistor, the third node being connected to an input of the first latch to control an operation thereof, wherein a signal path is provided from the third node to the ground voltage, the signal path including the sixth NMOS transistor directly connected to the ground voltage, wherein the first latch comprises:
    a seventh PMOS transistor having a source to which the power supply voltage is connected and a gate to which the third node is connected;
    an eighth PMOS transistor having a source to which a drain of the seventh PMOS transistor is connected, a gate to which the clock pulse signal is connected, and a drain to which the first node is connected; and
    a ninth NMOS transistor having a drain to which the second node is connected, a gate to which the third node is connected, and a source to which the ground voltage is connected.

8. The flip-flop of claim 7, wherein:
the clock pulse signal is generated from a clock signal by a clock pulse generation circuit; and
the clock pulse generation circuit comprises:
  first, second and third inverters receiving a clock signal and being serially connected to one another;

a NAND gate receiving the clock signal and an output of the third inverter; and a fourth inverter receiving an output of the NAND gate and generating the clock pulse signal.

9. The flip-flop of claim 7, wherein:

the clock pulse signal is generated from a clock signal by a clock pulse generation circuit; and the clock pulse generation circuit comprises:
- a NAND gate receiving the clock signal and a signal applied to a fourth node;
- a first inverter receiving an output of the NAND gate and outputting the clock pulse signal;
- a tenth PMOS transistor having a source to which the power supply voltage is connected, a gate to which the clock signal is connected, and a drain to which the fourth node is connected;
- an eleventh NMOS transistor having a drain to which the fourth node is connected, a gate to which the clock pulse signal is connected, and a source to which the ground voltage is connected;
- a second inverter receiving the fourth node;
- a twelfth NMOS transistor having a drain to which the fourth node is connected and a gate to which the clock signal is connected; and
- a thirteenth NMOS transistor having a drain to which a source of the twelfth NMOS transistor is connected, a gate to which an output of the second inverter is connected, and a source to which the ground voltage is connected.

10. The flip-flop of claim 7, wherein:

the clock pulse signal is generated from a clock signal by a clock pulse generation circuit; and the clock pulse generation circuit comprises:
- first, second and third inverters receiving a clock signal and being serially connected to one another;
- a NAND gate receiving the clock signal, an enable signal, and an output of the third inverter; and
- a fourth inverter receiving an output of the NAND gate and generating the clock pulse signal.

11. The flip-flop of claim 7, wherein:

the clock pulse signal is generated from a clock signal by a clock pulse generation circuit; and the clock pulse generation circuit comprises:
- a NAND gate receiving the clock signal, an enable signal, and a signal applied to a fourth node;
- a first inverter receiving an output of the NAND gate and outputting the clock pulse signal;
- a tenth PMOS transistor having a source to which the power supply voltage is connected, a gate to which the clock signal is connected, and a drain to which the fourth node is connected;
- an eleventh NMOS transistor having a drain to which the fourth node is connected, a gate to which the clock pulse signal is connected, and a source to which the ground voltage is connected;
- a second inverter receiving the fourth node;
- a twelfth NMOS transistor having a drain to which the fourth node is connected and a gate to which the clock signal is connected; and
- a thirteenth NMOS transistor having a drain to which a source of the twelfth NMOS transistor is connected, a gate to which an output of the second inverter is connected, and a source to which the ground voltage is connected.

12. The flip-flop of claim 7, wherein the second latch comprises:
- an inverter connected to the third node;
- a tenth PMOS transistor having a source to which the power supply voltage is connected and a gate to which an output of the inverter is connected;
- an eleventh PMOS transistor having a source to which a drain of the tenth PMOS transistor is connected, a gate to which the third node is connected, and a drain to which the third node is connected;
- a twelfth NMOS transistor having a drain to which the third node is connected and a gate to which the first node is connected; and
- a thirteenth NMOS transistor having a drain to which a source of the twelfth NMOS transistor is connected, a gate to which an output of the inverter is connected, and a source to which the ground voltage is connected.

13. A complex gate corresponding to a 3-input AND gate comprising:
- an input portion including first through third PMOS transistors, which are connected in parallel between a power supply voltage and a first node, and first through third NMOS transistors, which are serially connected between the first node and a second node, wherein gates of the first PMOS transistor and the first NMOS transistor are connected to first input data, gates of the second PMOS transistor and the second NMOS transistor are connected to second input data, and gates of the third PMOS transistor and the third NMOS transistor are connected to third input data;
- a fourth NMOS transistor having a drain to which a source of the third NMOS transistor is connected, a gate to which a clock pulse signal is applied, and a source to which a ground voltage is connected;
- a first latch latching logic levels of the first and second nodes in response to the clock pulse signal;
- a fifth PMOS transistor having a source to which the power supply voltage is connected and a gate to which the first node is connected;
- a sixth NMOS transistor having a drain to which a drain of the fifth PMOS transistor is connected and a gate to which the first node is connected;
- a seventh NMOS transistor having a drain to which a source of the sixth NMOS transistor is directly connected, a gate to which the clock pulse signal is connected, and a source to which the ground voltage is directly connected; and
- a second latch latching a logic level of a third node between the fifth PMOS transistor and the sixth NMOS transistor, the third node being connected to an input of the first latch to control an operation thereof, wherein a signal path is provided from the third node to the ground voltage, the signal path including the seventh NMOS transistor directly connected to the ground voltage, wherein the first latch comprises:
  - an eighth PMOS transistor having a source to which the power supply voltage is connected and a gate to which the third node is connected;
  - a ninth PMOS transistor having a source to which a drain of the eighth PMOS transistor is connected, a gate to which the clock pulse signal is connected, and a drain to which the first node is connected; and
  - a tenth NMOS transistor having a drain to which the second node is connected, a gate to which the third node is connected, and a source to which the ground voltage is connected.

14. A complex gate corresponding to a 3-input OR gate comprising:

an input portion including first though third PMOS transistors, which are serially connected between a power supply voltage and a first node, and first though third NMOS transistors, which are connected in parallel between the first node and a second node, wherein gates of the first PMOS transistor and the first NMOS transistor are connected to first input data, gates of the second PMOS transistor and the second NMOS transistor are connected to second input data, and gates of the third PMOS transistor and the third NMOS transistor are connected to third input data;

a fourth NMOS transistor having a drain to which a source of the third NMOS transistor is connected, a gate to which a clock pulse signal is applied, and a source to which a ground voltage is connected;

a first latch latching logic levels of the first and second nodes in response to the clock pulse signal;

a fifth PMOS transistor having a source to which the power supply voltage is connected and a gate to which the first node is connected;

a sixth NMOS transistor having a drain to which a drain of the fifth PMOS transistor is connected and a gate to which the first node is connected;

a seventh NMOS transistor having a drain to which a source of the sixth NMOS transistor is directly connected, a gate to which the clock pulse signal is connected, and a source to which the ground voltage is directly connected; and a second latch latching a logic level of a third node between the fifth PMOS transistor and the sixth NMOS transistor, the third node being connected to an input of the first latch to control an operation thereof, wherein a signal path is provided from the third node to the ground voltage, the signal path including the seventh NMOS transistor directly connected to the ground voltage, wherein the first latch comprises:

an eighth PMOS transistor having a source to which the power supply voltage is connected and a gate to which the third node is connected;

a ninth PMOS transistor having a source to which a drain of the eighth PMOS transistor is connected, a gate to which the clock pulse signal is connected, and a drain to which the first node is connected; and a tenth NMOS transistor having a drain to which the second node is connected, a gate to which the third node is connected, and a source to which the ground voltage is connected.

15. A complex gate corresponding to a 4-input AOI gate comprising:

an input portion including serially connected first and second PMOS transistors and serially connected third and fourth PMOS transistors, which are connected between a power supply voltage and a first node, and serially connected first and second NMOS transistors and serially connected third and fourth NMOS transistors, which are connected between the first node and a second node, wherein gates of the second PMOS transistor and the first NMOS transistor are connected to first input data, gates of the fourth PMOS transistor and the second NMOS transistor are connected to second input data, gates of the first PMOS transistor and the third NMOS transistor are connected to third input data, and gates of the third PMOS transistor and the fourth NMOS transistor are connected to fourth input data;

a fifth NMOS transistor having a drain to which sources of the second and fourth NMOS transistors are connected, a gate to which a clock pulse signal is applied, and a source to which a ground voltage is connected;

a first latch latching logic levels of the first and second nodes in response to the clock pulse signal;

a sixth PMOS transistor having a source to which the power supply voltage is connected and a gate to which the first node is connected;

a seventh NMOS transistor having a drain to which a drain of the sixth PMOS transistor is connected and a gate to which the first node is connected;

an eighth NMOS transistor having a drain to which a source of the seventh NMOS transistor is directly connected, a gate to which the clock pulse signal is connected, and a source to which the ground voltage is directly connected; and a second latch latching a logic level of a third node between the sixth PMOS transistor and the seventh NMOS transistor, the third node being connected to an input of the first latch to control an operation thereof, wherein a signal path is provided from the third node to the ground voltage, the signal path including the eighth NMOS transistor directly connected to the ground voltage, wherein the first latch comprises:

a ninth PMOS transistor having a source to which the power supply voltage is connected and a gate to which the third node is connected;

a tenth PMOS transistor having a source to which a drain of the ninth PMOS transistor is connected, a gate to which the clock pulse signal is connected, and a drain to which the first node is connected; and an eleventh NMOS transistor having a drain to which the second node is connected, a gate to which the third node is connected, and a source to which the ground voltage is connected.

16. The complex gate of any one of claims 13 through 15, wherein:

the clock pulse signal is generated from a clock signal by a clock pulse generation circuit; and the clock pulse generation circuit comprises:

first through third inverters receiving a clock signal and being serially connected to one another;

a NAND gate receiving the clock signal and an output of the third inverter; and a fourth inverter receiving an output of the NAND gate and generating the clock pulse signal.

17. The complex gate of any one of claims 13 through 15, wherein the second latch comprises:

an inverter connected to the third node;

a twelfth PMOS transistor having a source to which the power supply voltage is connected and a gate to which an output of the inverter is connected;

a thirteenth PMOS transistor having a source to which a drain of the twelfth PMOS transistor is connected, and a gate to which the third node is connected;

a fourteenth NMOS transistor having a drain to which a drain of the thirteenth PMOS transistor is connected and a gate to which the first node is connected; and a fifteenth NMOS transistor having a drain to which a source of the fourteenth NMOS transistor is connected, a gate to which an output of the inverter is connected, and a source to which the ground voltage is connected.

18. A flip-flop comprising:

a first PMOS transistor having a source to which a power supply voltage is connected and a gate to which input data is applied;

a second NMOS transistor having a drain to which a drain of the first PMOS transistor is connected and a gate to which the input data is applied;
a third NMOS transistor having a drain to which a source of the second NMOS transistor is connected, a gate to which a clock pulse signal is applied, and a source to which a ground voltage is connected;
a first latch latching a logic level of a first node between the first PMOS transistor and the second NMOS transistor and a level of a second node between the second and third NMOS transistors;
a fourth PMOS transistor having a source to which the power supply voltage is connected and a gate to which the first node is connected;
a fifth NMOS transistor having a drain to which a drain of the fourth PMOS transistor is connected and a gate to which the first node is connected;
a sixth NMOS transistor having a drain to which a source of the fifth NMOS transistor is connected, a gate to which the clock pulse signal is connected, and a source to which the ground voltage is connected; and
a second latch latching a logic level of a third node between the fourth PMOS transistor and the fifth NMOS transistor, wherein:
the clock pulse signal is generated from a clock signal by a clock pulse generation circuit; and
the clock pulse generation circuit comprises:
a NAND gate receiving the clock signal and a signal applied to a fourth node;
a first inverter receiving an output of the NAND gate and outputting the clock pulse signal;
a seventh PMOS transistor having a source to which the power supply voltage is connected, a gate to which the clock signal is connected, and a drain to which the fourth node is connected;
an eighth NMOS transistor having a drain to which the fourth node is connected, a gate to which the clock pulse signal is connected, and a source to which the ground voltage is connected;
a second inverter receiving the fourth node;
a ninth NMOS transistor having a drain to which the fourth node is connected and a gate to which the clock signal is connected; and
a tenth NMOS transistor having a drain to which a source of the ninth NMOS transistor is connected, a gate to which an output of the second inverter is connected, and a source to which the ground voltage is connected.

19. A flip-flop comprising:
a first PMOS transistor having a source to which a power supply voltage is connected and a gate to which input data is applied;
a second NMOS transistor having a drain to which a drain of the first PMOS transistor is connected and a gate to which the input data is applied;
a third NMOS transistor having a drain to which a source of the second NMOS transistor is connected, a gate to which a clock pulse signal is applied, and a source to which a ground voltage is connected;
a first latch latching a logic level of a first node between the first PMOS transistor and the second NMOS transistor and a level of a second node between the second and third NMOS transistors;
a fourth PMOS transistor having a source to which the power supply voltage is connected and a gate to which the first node is connected;
a fifth NMOS transistor having a drain to which a drain of the fourth PMOS transistor is connected and a gate to which the first node is connected;
a sixth NMOS transistor having a drain to which a source of the fifth NMOS transistor is connected, a gate to which the clock pulse signal is connected, and a source to which the ground voltage is connected; and
a second latch latching a logic level of a third node between the fourth PMOS transistor and the fifth NMOS transistor, wherein:
the clock pulse signal is generated from a clock signal by a clock pulse generation circuit; and
the clock pulse generation circuit comprises:
a NAND gate receiving the clock signal, an enable signal, and a signal applied to a fourth node;
a first inverter receiving an output of the NAND gate and outputting the clock pulse signal;
a seventh PMOS transistor having a source to which the power supply voltage is connected, a gate to which the clock signal is connected, and a drain to which the fourth node is connected;
an eighth NMOS transistor having a drain to which the fourth node is connected, a gate to which the clock pulse signal is connected, and a source to which the ground voltage is connected;
a second inverter receiving the fourth node;
a ninth NMOS transistor having a drain to which the fourth node is connected and a gate to which the clock signal is connected; and
a tenth NMOS transistor having a drain to which a source of the ninth NMOS transistor is connected, a gate to which an output of the second inverter is connected, and a source to which the ground voltage is connected.

20. A flip-flop comprising:
a first PMOS transistor having a source to which a power supply voltage is connected and a gate to which input data is applied;
a second NMOS transistor having a drain to which a drain of the first PMOS transistor is connected and a gate to which the input data is applied;
a third NMOS transistor having a drain to which a source of the second NMOS transistor is connected, a gate to which a clock pulse signal is applied, and a source to which a ground voltage is connected;
a first latch latching a logic level of a first node between the first PMOS transistor and the second NMOS transistor and a level of a second node between the second and third NMOS transistors;
a fourth PMOS transistor having a source to which the power supply voltage is connected and a gate to which the first node is connected;
a fifth NMOS transistor having a drain to which a drain of the fourth PMOS transistor is connected and a gate to which the first node is connected;
a sixth NMOS transistor having a drain to which a source of the fifth NMOS transistor is connected, a gate to which the clock pulse signal is connected, and a source to which the ground voltage is connected; and
a second latch latching a logic level of a third node between the fourth PMOS transistor and the fifth NMOS transistor, wherein the first latch comprises:
a seventh PMOS transistor having a source to which the power supply voltage is connected and a gate to which the third node is connected;
an eighth PMOS transistor having a source to which a drain of the seventh PMOS transistor is connected, a gate to which the clock pulse signal is connected, and a drain to which the first node is connected; and a ninth NMOS transistor having a drain to which the second node is connected, a gate to which the third node is connected, and a source to which the ground voltage is connected.

21. A complex gate corresponding to a 3-input AND gate comprising:

an input portion including first through third PMOS transistors, which are connected in parallel between a power supply voltage and a first node, and first through third NMOS transistors, which are serially connected between the first node and a second node, wherein gates of the first PMOS transistor and the first NMOS transistor are connected to first input data, gates of the second PMOS transistor and the second NMOS transistor are connected to second input data, and gates of the third PMOS transistor and the third NMOS transistor are connected to third input data;

a fourth NMOS transistor having a drain to which a source of the third NMOS transistor is connected, a gate to which a clock pulse signal is applied, and a source to which a ground voltage is connected;

a first latch latching logic levels of the first and second nodes;

a fifth PMOS transistor having a source to which the power supply voltage is connected and a gate to which the first node is connected;

a sixth NMOS transistor having a drain to which a drain of the fifth PMOS transistor is connected and a gate to which the first node is connected;

a seventh NMOS transistor having a drain to which a source of the sixth NMOS transistor is connected, a gate to which the clock pulse signal is connected, and a source to which the ground voltage is connected; and a second latch latching a logic level of a third node between the fifth PMOS transistor and the sixth NMOS transistor, wherein the first latch comprises:

a ninth PMOS transistor having a source to which the power supply voltage is connected and a gate to which the third node is connected;

a tenth PMOS transistor having a source to which a drain of the ninth PMOS transistor is connected, a gate to which the clock pulse signal is connected, and a drain to which the first node is connected; and an eleventh NMOS transistor having a drain to which the second node is connected, a gate to which the third node is connected, and a source to which the ground voltage is connected.

22. A complex gate corresponding to a 3-input OR gate comprising:

an input portion including first through third PMOS transistors, which are serially connected between a power supply voltage and a first node, and first through third NMOS transistors, which are connected in parallel between the first node and a second node, wherein gates of the first PMOS transistor and the first NMOS transistor are connected to first input data, gates of the second PMOS transistor and the second NMOS transistor are connected to second input data, and gates of the third PMOS transistor and the third NMOS transistor are connected to third input data;

a fourth NMOS transistor having a drain to which a source of the third NMOS transistor is connected, a gate to which a clock pulse signal is applied, and a source to which a ground voltage is connected;

a first latch latching logic levels of the first and second nodes;

a fifth PMOS transistor having a source to which the power supply voltage is connected and a gate to which the first node is connected;

a sixth NMOS transistor having a drain to which a drain of the fifth PMOS transistor is connected and a gate to which the first node is connected;

a seventh NMOS transistor having a drain to which a source of the sixth NMOS transistor is connected, a gate to which the clock pulse signal is connected, and a source to which the ground voltage is connected; and a second latch latching a logic level of a third node between the fifth PMOS transistor and the sixth NMOS transistor, wherein the first latch comprises:

a ninth PMOS transistor having a source to which the power supply voltage is connected and a gate to which the third node is connected;

a tenth PMOS transistor having a source to which a drain of the ninth PMOS transistor is connected, a gate to which the clock pulse signal is connected, and a drain to which the first node is connected; and an eleventh NMOS transistor having a drain to which the second node is connected, a gate to which the third node is connected, and a source to which the ground voltage is connected.

23. A complex gate corresponding to a 4-input AOI gate comprising:

an input portion including serially connected first and second PMOS transistors and serially connected third and fourth PMOS transistors, which are connected between a power supply voltage and a first node, and serially connected first and second NMOS transistors and serially connected third and fourth NMOS transistors, which are connected between the first node and a second node, wherein gates of the first PMOS transistor and the first NMOS transistor are connected to first input data, gates of the second PMOS transistor and the second NMOS transistor are connected to second input data, gates of the third PMOS transistor and the third NMOS transistor are connected to third input data, and gates of the fourth PMOS transistor and the fourth NMOS transistor are connected to fourth input data;

a fifth NMOS transistor having a drain to which sources of the second and fourth NMOS transistors are connected, a gate to which a clock pulse signal is applied, and a source to which a ground voltage is connected;

a first latch latching logic levels of the first and second nodes;

a sixth PMOS transistor having a source to which the power supply voltage is connected and a gate to which the first node is connected;

a seventh NMOS transistor having a drain to which a drain of the sixth PMOS transistor is connected and a gate to which the first node is connected;

an eighth NMOS transistor having a drain to which a source of the seventh NMOS transistor is connected, a gate to which the clock pulse signal is connected, and a source to which the ground voltage is connected; and a second latch latching a logic level of a third node between the sixth PMOS transistor and the seventh NMOS transistor, wherein the first latch comprises:

a ninth PMOS transistor having a source to which the power supply voltage is connected and a gate to which the third node is connected;

a tenth PMOS transistor having a source to which a drain of the ninth PMOS transistor is connected, a gate to which the clock pulse signal is connected, and a drain to which the first node is connected; and an eleventh NMOS transistor having a drain to which the second node is connected, a gate to which the third node is connected, and a source to which the ground voltage is connected.

* * * * *